United States Patent
Thyamagondlu et al.

(10) Patent No.: US 10,990,547 B2
(45) Date of Patent: Apr. 27, 2021

(54) DYNAMICALLY RECONFIGURABLE NETWORKING USING A PROGRAMMABLE INTEGRATED CIRCUIT

(71) Applicant: Xilinx, Inc., San Jose, CA (US)

(72) Inventors: Chandrasekhar S. Thyamagondlu, Sunnyvale, CA (US); Ravi Sunkavalli, San Jose, CA (US); Ravi N. Kurlagunda, Fremont, CA (US); Ellery Cochell, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 16/537,605

(22) Filed: Aug. 11, 2019

(65) Prior Publication Data
US 2021/0042252 A1 Feb. 11, 2021

(51) Int. Cl.
*G06F 13/28* (2006.01)
*G06F 30/34* (2020.01)

(52) U.S. Cl.
CPC .............. *G06F 13/28* (2013.01); *G06F 30/34* (2020.01); *G06F 2213/0026* (2013.01); *G06F 2213/3808* (2013.01)

(58) Field of Classification Search
CPC ................. G06F 13/28; G06F 17/5054; G06F 2213/0026; G06F 2213/3808
See application file for complete search history.

(56) References Cited

U.S. PATENT DOCUMENTS

| | | | |
|---|---|---|---|
| 6,091,263 A | 7/2000 | New et al. | |
| 6,150,839 A | 11/2000 | New et al. | |
| 6,204,687 B1 | 3/2001 | Schultz et al. | |
| 6,462,579 B1 | 10/2002 | Camilleri et al. | |
| 6,507,211 B1 | 1/2003 | Schultz et al. | |
| 6,525,562 B1 | 2/2003 | Schultz et al. | |
| 6,526,557 B1 | 2/2003 | Young et al. | |
| 6,573,748 B1 | 6/2003 | Trimberger | |
| 6,625,794 B1 | 9/2003 | Trimberger | |
| 6,759,869 B1 | 7/2004 | Young et al. | |
| 6,810,514 B1 | 10/2004 | Alfke et al. | |
| 6,836,842 B1 | 12/2004 | Guccione et al. | |

(Continued)

FOREIGN PATENT DOCUMENTS

| | | |
|---|---|---|
| WO | 2010012568 A1 | 2/2010 |
| WO | 2020097013 A1 | 5/2020 |

OTHER PUBLICATIONS

Abel, F., et al., "An FPGA Platform for Hyperscalers," In 2017 IEEE 25th Annual Symposium on High-Performance Interconnects (HOTI) Aug. 28, 2017 (pp. 29-32). IEEE.

(Continued)

*Primary Examiner* — Henry Tsai
*Assistant Examiner* — John B Roche
(74) *Attorney, Agent, or Firm* — Kevin T. Cuenot

(57) ABSTRACT

A device includes a platform implemented, at least in part, in a static region of programmable circuitry and a dynamic region of programmable circuitry configured to implement user-specified circuitry in communication with the platform. The platform is configured to establish and maintain a first communication link with a host data processing system and a second communication link with a network while at least a portion of the dynamic region of programmable circuitry is dynamically reconfigured.

20 Claims, 16 Drawing Sheets

(56) References Cited

U.S. PATENT DOCUMENTS

| | | | |
|---|---|---|---|
| 6,907,595 B2* | 6/2005 | Curd | G06F 15/7867 |
| | | | 326/39 |
| 7,024,651 B1 | 4/2006 | Camilleri et al. | |
| 7,057,413 B1 | 6/2006 | Young et al. | |
| 7,109,750 B2 | 9/2006 | Vadi et al. | |
| 7,124,338 B1 | 10/2006 | Mark et al. | |
| 7,138,820 B2 | 11/2006 | Goetting et al. | |
| 7,218,137 B2 | 5/2007 | Vadi et al. | |
| 7,224,184 B1* | 5/2007 | Levi | H03K 19/17736 |
| | | | 326/38 |
| 7,233,532 B2 | 6/2007 | Vadi et al. | |
| 7,235,999 B2 | 6/2007 | Goetting et al. | |
| 7,302,625 B1 | 11/2007 | Payakapan et al. | |
| 7,477,072 B1 | 1/2009 | Kao et al. | |
| 7,478,357 B1 | 1/2009 | Mason et al. | |
| 7,482,836 B2 | 1/2009 | Levi et al. | |
| 7,509,617 B1 | 3/2009 | Young | |
| 7,518,396 B1 | 4/2009 | Kondapalli et al. | |
| 7,546,572 B1 | 6/2009 | Ballagh et al. | |
| 7,577,707 B2 | 8/2009 | Hufferd et al. | |
| 7,590,790 B2 | 9/2009 | Wang et al. | |
| 7,599,299 B2 | 10/2009 | Goetting et al. | |
| 7,619,442 B1 | 11/2009 | Mason et al. | |
| 7,640,527 B1 | 12/2009 | Dorairaj et al. | |
| 7,724,815 B1 | 5/2010 | Raha et al. | |
| 7,746,099 B1 | 6/2010 | Chan et al. | |
| 7,752,349 B2 | 7/2010 | Ishida et al. | |
| 8,102,188 B1 | 1/2012 | Chan et al. | |
| 8,359,448 B1 | 1/2013 | Neuendorffer | |
| 8,415,974 B1 | 4/2013 | Lysaght | |
| 8,504,373 B2 | 8/2013 | Bansal et al. | |
| 8,719,750 B1 | 5/2014 | Balzli, Jr. | |
| 8,928,351 B1 | 1/2015 | Konduru | |
| 9,218,443 B1 | 12/2015 | Styles | |
| 9,257,987 B1 | 2/2016 | Molson | |
| 9,722,613 B1* | 8/2017 | Schultz | H03K 19/17756 |
| 10,447,273 B1* | 10/2019 | Roberts | G06F 11/3409 |
| 10,725,942 B2 | 7/2020 | Thyamagondlu et al. | |
| 2003/0021346 A1 | 1/2003 | Bixby et al. | |
| 2003/0097498 A1 | 5/2003 | Sano et al. | |
| 2004/0019729 A1 | 1/2004 | Kelley et al. | |
| 2005/0114566 A1 | 5/2005 | Chen et al. | |
| 2005/0228913 A1 | 10/2005 | Matthews et al. | |
| 2006/0265531 A1 | 11/2006 | Adams et al. | |
| 2007/0208895 A1 | 9/2007 | Chang et al. | |
| 2008/0279209 A1* | 11/2008 | Hui | H04L 49/15 |
| | | | 370/445 |
| 2010/0186014 A1 | 7/2010 | Vaghani et al. | |
| 2010/0321397 A1 | 12/2010 | Ginzburg | |
| 2013/0160016 A1 | 6/2013 | Gummaraju et al. | |
| 2015/0095109 A1* | 4/2015 | Kodde | G06F 7/76 |
| | | | 705/7.29 |
| 2015/0134891 A1 | 5/2015 | Jo | |
| 2016/0203091 A1 | 7/2016 | Lee | |
| 2017/0206169 A1 | 7/2017 | Coppola et al. | |
| 2019/0065290 A1* | 2/2019 | Custodio | G02B 6/444 |
| 2019/0096813 A1 | 3/2019 | Lesea | |
| 2019/0138493 A1 | 5/2019 | Teh et al. | |
| 2020/0151120 A1 | 5/2020 | Thyamagondlu et al. | |
| 2020/0153756 A1 | 5/2020 | Thyamagondlu et al. | |

OTHER PUBLICATIONS

Anderson, B., Detecting Encrypted Malware Traffic (Without Decryption), [online] Cisco Blog/Security, Jun. 23, 2017, retrieved from the Internet: <https://blogs.cisco.com/security/detecting-encrypted-malware-traffic-without-decryption>, 9. pg.

Chiou, D., "The Microsoft catapult project," In 2017 IEEE International Symposium on Workload Characterization (IISWC) Oct. 1, 2017 (pp. 124-124). IEEE.

Firestone, D. et al., "Azure Accelerated Networking: SmartNICs in the Public Cloud," In15th {USENIX} Symposium on Networked Systems Design and Implementation ({NSDI} 18), 2018, pp. 51-66.

Liguori, A., "The Nitro Project: Next-Generation EC2 Infrastructure," AWS Tech Talks (webinar, talk with slides), Feb. 5, 2018. YouTube video.

Mellanox Technologies, "Mellanox Innova—2 Flex Open Programmable SmartNIC," 2018 , Product Brochure MLNX54019PG, Rev. 1.4, 3 pg.

Microsoft, Inc., "Microsoft unveils Project Brainwave for real-time AI—Microsoft Research," [olnline] Microsoft © 2019, retrieved from the Internet: <https://www.microsoft.com/en-us/research/blog/microsoft-unveils-project-brainwave/>, 8 pg.

SolarFlare Communications, Inc., "SFA7942Q Dual-Port 40GbE QSFP+Halfl-Lenth ApplicationOnload Engine," 2015, Product Brochure SF-114649-CD Issue 3, 2 pg.

Xilinx Inc., White Paper WP499, Breathe New Life into Your Data Center with Alveo Adaptable Accelerator Cards, San Jose, CA USA.

Xilinx Inc.,White Paper WP505, Versal: The First Adaptive Compute Acceleration Platform (ACAP), San Jose, CA USA.

Xilinx, Inc.,"SDAccel Environment User Guide," UG1023 (v2018.3), Jan. 24, 2019, 165 pg, San Jose, CA USA.

"QDMA Subsystem for PCI Express v1.0," Product Guide PG302 (v1.0), Vivado Design Suite, Apr. 17, 2018, Xilinx, Inc., Copyright © 2018, San Jose, CA, 157 pg.

Sunkavalli, R., "Network Acceleration XDF 2018," Xilinx Developer Forum 2018 (Silicon Valley), Oct. 1, 2018, XP055684236, Retrieved from the Internet: <https://www.xilinx.com/content/dam/xilinx/imgs/developer-forum/2018-silicon-valley/Cloud-Converged-10-Acceleration-Plafform.pdf>, retrieved Apr. 8, 2020, pp. 5-13.

* cited by examiner

US 10,990,547 B2

DYNAMICALLY RECONFIGURABLE NETWORKING USING A PROGRAMMABLE INTEGRATED CIRCUIT

TECHNICAL FIELD

This disclosure relates to integrated circuits (ICs) and, more particularly, to dynamically reconfigurable networking using a programmable IC.

BACKGROUND

A programmable integrated circuit (IC) refers to a type of device that includes programmable logic. An example of a programmable IC is a field programmable gate array (FPGA). An FPGA is characterized by the inclusion of programmable circuit blocks. Examples of programmable circuit blocks include, but are not limited to, input/output blocks (IOBs), configurable logic blocks (CLBs), dedicated random access memory blocks (BRAM), digital signal processing blocks (DSPs), processors, clock managers, and delay lock loops (DLLs).

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that may include, for example, function generators, registers, arithmetic logic, and so forth.

The programmable interconnect and programmable logic circuitries are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Modern programmable ICs have evolved to include programmable logic in combination with one or more other subsystems. For example, some programmable ICs have evolved into System-on-Chips or "SoCs" that include both programmable logic and a hardwired processor. Other varieties of programmable ICs include additional and/or different subsystems. The phrase "programmable IC" refers to devices that include at least a portion of programmable logic and that are either partially or fully programmable.

In general, the functionality of programmable ICs is controlled by the data bits provided to the device for that purpose. The data bits may be stored in volatile memory (e.g., static memory cells, as in FPGAs and some other programmable ICs such as Complex Programmable Logic Devices (CPLDs)), in non-volatile memory (e.g., FLASH memory, as in some CPLDs), or in any other type of memory cell.

SUMMARY

A device can include a platform implemented, at least in part, in a static region of programmable circuitry and a dynamic region of programmable circuitry configured to implement user-specified circuitry in communication with the platform. The platform can be configured to establish and maintain a first communication link with a host data processing system and a second communication link with a network while at least a portion of the dynamic region of programmable circuitry is dynamically reconfigured.

A method can include providing, on a device, a platform at least partially implemented in a static region of programmable circuitry and providing, on the device, a dynamic region of programmable circuitry configured to implement user-specified circuitry in communication with the platform. The platform is configured to establish and maintain a first communication link with a host data processing system and a second communication link with a network while at least a portion of the dynamic region of programmable circuitry is dynamically reconfigured.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

Figure 1:
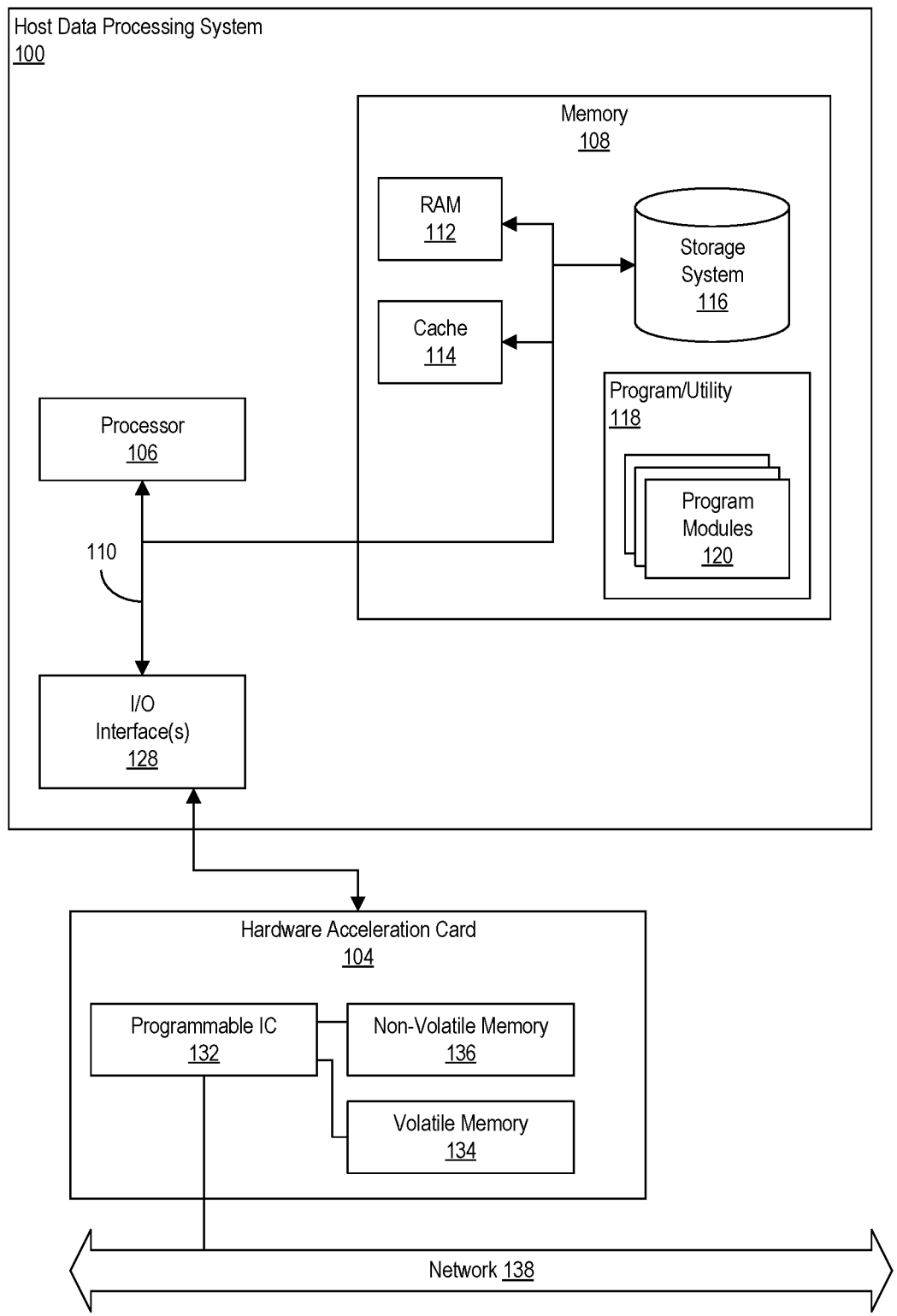
FIG. 1 illustrates an example of a host data processing system and a hardware acceleration card.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to dynamically reconfigurable networking using a programmable IC. In accordance with the inventive arrangements described herein, a programmable IC is used to implement and deploy dynamically reconfigurable network-attached acceleration functions. The functionality described may be provided within a single device. For example, the platform implemented in the programmable IC, as described herein, is capable of providing compute, storage, and networking acceleration functions within a single programmable IC. The platform supports the implementation and deployment of user-specified circuits for performing one or more network-attached acceleration functions. These user-specified circuits may be dynamically inserted and/or removed from the platform on the fly without affecting network traffic processed by the platform of the programmable IC. As such, the platform may be functionally expanded through the inclusion, removal, and/or swapping of the user-specified circuits over time during operation of the programmable IC.

Network attached acceleration refers to processing that is typically performed on a network interface card (NIC) that is plugged into a data processing system such as a server (e.g., a host system) via a communication bus. The NIC may include a Field Programmable Gate Array (FPGA) connected to an Application-Specific Integrated Circuit (ASIC). The ASIC typically receives data through network ports and performs basic packet processing functions while the FPGA is used to perform other enhanced network acceleration functions referred to as "Smart NIC" functions on the data. The ASIC may then deliver the processed data to the host system.

In accordance with the inventive arrangements described within this disclosure, a single device, e.g., a single programmable IC such as an FPGA, can be used to provide both the ASIC functionality and the enhanced or Smart NIC functions. The platform described herein, as implemented in a programmable IC, supports the data processing described and the ability to implement different custom or user-specified circuits over time without disrupting the ability of the programmable IC to continue performing basic NIC functions. Thus, portions of the programmable IC may be dynamically reconfigured (e.g., partially reconfigured) to perform packet processing operations relating to compute, storage, and/or networking acceleration functions while other regions on the programmable IC are able to continue operating uninterrupted so as not to lose data or the communication link to the network. The programmable IC may also maintain the communication link to the host system. As such, the programmable IC is capable of continuing to pass data between the network and the host system without losing data while one or more different user-specified circuits are dynamically inserted, removed, and/or replaced at runtime for processing the network data.

The inventive arrangements provide a platform in which additional functionality can be added to basic NIC functions provided by a NIC controller. The additional functionality may relate to networking, compute, and/or storage acceleration. Developers are able to create specific functions without having to recreate the entire NIC infrastructure provided by the platform. Use of the platform provides various benefits. These benefits may include reduced compile time when developing hardware for implementation in the programmable IC since the platform need not be reimplemented for each different user-specified circuit that is developed. These benefits may also include reduced time for downloading configuration data to the programmable IC to implement the user-specified circuitry at runtime since the platform need not be reimplemented in the programmable IC each time that different user-specified circuitry is added, removed, and/or modified.

Further aspects and/or benefits of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example of a host data processing system (host system) 100 and a hardware acceleration card (card) 104. The components of host system 100 may include, but are not limited to, one or more processors 106 (e.g., central processing units), a memory 108, and a bus 110 that couples various system components including memory 108 to processor(s) 106. Processor(s) 106 may include any of a variety of processors that are capable of executing program code. Example processor types include, but are not limited to, processors having an x86 type of architecture (IA-32, IA-64, etc.), Power Architecture, ARM processors, and the like.

Bus 110 represents one or more of any of several types of communication bus structures, including a memory bus or memory controller, a peripheral bus, an accelerated graphics port, and a processor or local bus using any of a variety of available bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, Peripheral Component Interconnect (PCI) bus, and PCI Express (PCIe) bus.

Host system 100 typically includes a variety of computer readable media. Such media may be any available media that is accessible by host system 100 and may include any combination of volatile media, non-volatile media, removable media, and/or non-removable media.

Memory 108 may include computer readable media in the form of volatile memory, such as random-access memory (RAM) 112 and/or cache memory 114. Host system 100 may also include other removable/non-removable, volatile/non-volatile computer system storage media. By way of example, storage system 116 may be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each may be connected to bus 110 by one or more data media interfaces. As will be further depicted and described below, memory 108 may include at least one computer program product having a set (e.g., at least one) of program modules (e.g., program code) that are configured to carry out the functions and/or operations described within this disclosure.

For example, program/utility 118, having a set (at least one) of program modules 120 which may include, but are not limited to, an operating system, one or more application programs, other program modules, and/or program data, is stored in memory 108. Program modules 120 generally carry out the functions and/or methodologies described herein at least with respect to operations performed by host system 100. For example, program modules 120 may include one or more applications and a driver or daemon for communicating with hardware acceleration card 104 and/or programmable IC 132.

Program/utility 118 is executable by processor(s) 106. Program/utility 118 and any data items used, generated, and/or operated upon by processor(s) 106 are functional data structures that impart functionality when employed by processor(s) 106. As defined within this disclosure, a "data structure" is a physical implementation of a data model's organization of data within a physical memory. As such, a data structure is formed of specific electrical or magnetic structural elements in a memory. A data structure imposes physical organization on the data stored in the memory as used by an application program executed using a processor.

Host system 100 may include one or more Input/Output (I/O) interfaces 128 communicatively linked to bus 110. I/O interface(s) 128 allow host system 100 to communicate with external devices, couple to external devices that allow user(s) to interact with host system 100, couple to external devices that allow host system 100 to communicate with other computing devices, and the like. For example, host system 100 may be communicatively linked to a hardware acceleration card 104 through I/O interface(s) 128. Host system 100 may be coupled to other external devices such as a keyboard and/or display (not shown) via I/O interface(s) 128. Examples of I/O interfaces 128 may include, but are not limited to, network cards, modems, network adapters, hardware controllers, etc.

In an example implementation, the I/O interface 128 through which host system 100 communicates with hardware acceleration card 104 is a PCIe adapter. Hardware acceleration card 104 may be implemented as a circuit board that couples to host system 100. Hardware acceleration card 104 may, for example, be inserted into a card slot, e.g., an available bus and/or PCIe slot, of host system 100.

Hardware acceleration card 104 includes a programmable IC 132. Hardware acceleration card 104 also includes volatile memory 134 coupled to programmable IC 132 and a non-volatile memory 136 also coupled to the programmable IC 132. Volatile memory 134 may be implemented as a RAM and is considered a "local memory" of programmable IC 132, whereas memory 108, being within host system 100, is not considered local to programmable IC 132. Memory 108, for example, is local to host system 100. In some implementations, volatile memory 134 may include multiple gigabytes of RAM, e.g., 64 GB of RAM. Non-volatile memory 136 may be implemented as flash memory. Non-volatile memory 136 is considered local to programmable IC 132.

In the example of FIG. 1, programmable IC 132 is connected to a network 138. In one example, network 138 is an Ethernet type of network. Network 138 may operate at any of a variety of different speeds. For example, network 138 may be a 10G, 25G, 50G, 100G, 200G, 400G, or other speed network. In particular implementations, network 138 may be, include, or couple to a 5G network. Programmable IC 132 includes an Ethernet interface (not shown) that is used to connect to, e.g., communicatively link, programmable IC 132 to network 138. For example, programmable IC 132 may be connected via network 138 to an Ethernet switch or one or more other network connected devices. For purposes of illustration, the term "network" refers to network 138 herein, e.g., an Ethernet network.

FIG. 1 is not intended to suggest any limitation as to the scope of use or functionality of the examples described herein. Host system 100 is an example of computer hardware (e.g., a system) that is capable of performing the various operations described within this disclosure relating to hardware acceleration card 104 and/or programmable IC 132.

Host system 100 is only one example implementation of a computer that may be used with a hardware acceleration card. Host system 100 is shown in the form of a computing device, e.g., a computer or server. Host system 100 can be practiced as a standalone device, as a bare metal server, in a cluster, or in a distributed cloud computing environment. In a distributed cloud computing environment, tasks are performed by remote processing devices that are linked through a communications network. In a distributed cloud computing environment, program modules may be located in both local and remote computer system storage media including memory storage devices.

As used herein, the term "cloud computing" refers to a computing model that facilitates convenient, on-demand network access to a shared pool of configurable computing resources such as networks, servers, storage, applications, ICs (e.g., programmable ICs) and/or services. These computing resources may be rapidly provisioned and released with minimal management effort or service provider interaction. Cloud computing promotes availability and may be characterized by on-demand self-service, broad network access, resource pooling, rapid elasticity, and measured service.

Some computing environments, e.g., cloud computing environments and/or edge computing environments using host system 100 or other suitable data processing system, generally support the FPGA-as-a-Service (FaaS) model where user functions are hardware accelerated as user-specified or custom circuit designs, and implemented within programmable ICs operating under control of host computer systems. Other examples of cloud computing models are described by the National Institute of Standards and Technology (NIST) and, more particularly, by the Information Technology Laboratory of NIST.

Host system 100 is operational with numerous other general-purpose or special-purpose computing system environments or configurations. Examples of computing systems, environments, and/or configurations that may be suitable for use with host system 100 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Figure 2A:
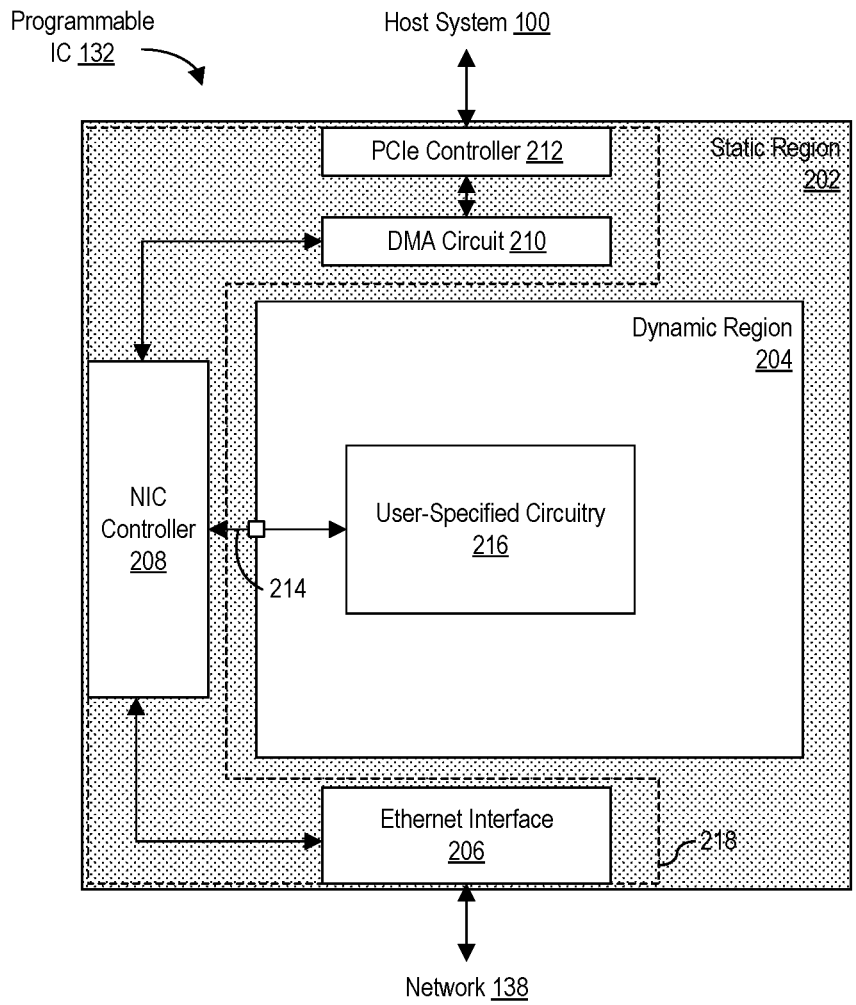
FIG. 2A illustrates an example platform implemented in a programmable integrated circuit (IC).

FIG. 2A illustrates an example platform 218 implemented in programmable IC 132 of FIG. 1. Programmable IC 132 includes a static region 202 of programmable circuitry and a dynamic region 204 of programmable circuitry. While both static region 202 and dynamic region 204 are implemented using programmable circuitry, it should be appreciated that one or both regions may include one or more hardwired circuit blocks as described herein in greater detail in connection with the remaining figures.

Static region 202 represents a region of programmable circuitry of programmable IC 132 that, once configured with a circuit design, does not change over time. While static region 202 may be reconfigured, such an operation would take programmable IC 132 offline (e.g., offline from host system 100 and/or network 138). For purposes of illustration, static region 202 is shown with shading and is used to implement a platform 218 that provides networking operations. Platform 218 is specified by a circuit design that is loaded into programmable IC 132, e.g., as a configuration bitstream. In the example of FIG. 2A, platform 218 includes the various circuit blocks included in the shaded region. Platform 218, once implemented in programmable IC 132, provides functional networking, host system interfaces, and optionally memory interfaces for the duration of operation. Platform 218 is capable of passing network data from an Ethernet interface to host system 100 (e.g., processor 106 via a communication bus with basic network interface controller (NIC) functionality.

Dynamic region 204 represents a region of programmable circuitry of programmable IC 132 that may be dynamically reconfigured over time to implement different user-specified (e.g., custom) circuits therein. The user-specified circuits implemented in dynamic region 204 are designed to connect to circuit block(s) implemented in platform 218 in static region 202. In general, user-specified circuits implemented in dynamic region 204 are used to extend the functionality and/or operability of platform 218.

Within static region 202, a circuit design has been loaded to create platform 218. For example, a full or partial configuration bitstream specifying platform 218 is loaded into programmable IC 132. In the example of FIG. 2A, platform 218 includes an Ethernet interface 206, a NIC controller 208, a direct memory access (DMA) circuit 210, and a Peripheral Component Interconnect Express (PCIe) controller 212. Thus, Ethernet interface 206, NIC controller 208, DMA circuit 210, and PCIe controller 212 are implemented in static region 202. Ethernet interface 206 is connected to NIC controller 208. NIC controller 208 connects to DMA circuit 210. DMA circuit 210 connects to PCIe controller 212. Ethernet interface 206 is capable of establishing a communication link to network 138 (e.g., a node or switch therein). PCIe controller 212 is capable of establishing a communication link to host system 100.

In other examples, platform 218 may use other types of interfaces to connect to network 138. Further, platform 218 may use other types of interfaces to connect to host system 100. The particular examples described within this disclosure are provided for purposes of illustration and not limitation. Other alternative types of interfaces may be used.

In the example of FIG. 2A, each of Ethernet interface 206, NIC controller 208, DMA circuit 210, and PCIe controller 212 is implemented using programmable circuitry. In one or more other example implementations, one or more or all (e.g., any combination) of Ethernet interface 206, DMA circuit 210, and/or PCIe controller 212 is/are implemented as hardwired circuit blocks.

NIC controller 208 is implemented with one or more communication interfaces 214 that connect to dynamic region 204. In particular implementations, communication interface 214 and/or other communication interfaces between NIC controller 208 and dynamic region 204 may be implemented as stream interfaces. An example of a stream interface is one compliant with AMBA® 4 AXI4-Stream Protocol (e.g., "AXI"). It should be appreciated that other types of stream interfaces may be used to connect NIC controller 208 to dynamic region 204 and that AXI is provided only as a non-limiting example. Another example of a stream interface may be a network-on-chip.

In one aspect, communication interface 214 is software-controllable. For example, the configuration bitstreams used to implement user-specified circuitry may be stored with associated metadata. The metadata may specify the state of the communication interface 214, e.g., whether on or off. The metadata may specify which of communication interfaces 214, in the case of a plurality of such interfaces, are enabled and are to be used. In this regard, the metadata describes connectivity between platform 218 and dynamic region 204 and/or user-specified circuitry 216.

As an example, communication interface 214 may be implemented using one or more multiplexers that may be provided control signals (e.g., select signals) from a control interface. The select signals may be specified by the metadata. Once a configuration bitstream is loaded into programmable IC 132 to implement user-specified circuitry 216, host system 100 is capable of obtaining the metadata corresponding to the configuration bitstream and writing the metadata to programmable IC 132. The metadata may be provided to the control interface which generates the appropriate select signals to the multiplexers of communication interfaces 214 to activate and/or deactivate communication interfaces 214 as needed to communicate with user-specified circuitry 216.

Via communication interface 214, data can move from platform 218 into dynamic region 202, enter and be processed by user-specified circuitry 216 in dynamic region 202, and return to platform 218. NIC controller 208 may have a plurality of communication interfaces that may be software controllable as described. For example, in terms of ingress, NIC controller 208 may receive data from network 138 via Ethernet interface 206. NIC controller 208 may or may not operate on the data prior to providing the data to user-specified circuitry 216 over communication interface 214. User-specified circuitry 216 may operate on the received data and provide the processed data back to NIC controller 208 via communication interface 214. User-specified circuitry 216, for example, may perform one or more packet processing, or Smart NIC, functions. NIC controller 208 may or may not perform further processing on the data and provide the data to host system 100 via DMA circuit 210 and PCIe controller 212. In another example, NIC controller 208 may be configured to route data received from Ethernet interface 206 back to Ethernet interface 206 to network 138 after processing performed by NIC controller 208 and/or user-specified circuitry 216 or without any such processing.

In terms of egress, NIC controller 208 may receive data from host system 100 via PCIe controller 212 and DMA circuit 210. NIC controller 208 may or may not operate on the data prior to providing the data to the user-specified circuitry 216 over communication interface 214. User-specified circuitry 216 may operate on the received data and provide the processed data back to NIC controller 208 via communication interface 214. NIC controller 208 may or may not perform further processing on the data prior to providing the data to network 138 via Ethernet interface 206. In another example, NIC controller 208 may be configured to route data received from host system 100 back to host system 100 after processing performed by NIC controller 208 and/or user-specified circuitry 216 or without any such processing.

Dynamic region 204 is implemented to include one or more partial reconfiguration (PR) regions. A PR region of programmable IC 132 refers to a region of programmable circuitry that is reserved for implementing one or more different user-specified (e.g., custom) circuit designs dynamically over time. Dynamic region 204 may include more than one PR region. In general, each different PR region implemented in dynamic region 204 is independently re-configurable. In the example of FIG. 2A, dynamic region 204 implements a single PR region.

In the example of FIG. 2A, static region 202 refers to the portions of programmable IC 132 that are external to dynamic region 204. Platform 218, as implemented in static region 202, does not change, e.g., remains static, while circuitry in dynamic region 204 can be changed to implement other, different user-specified circuit designs over time. In the example of FIG. 2A, a user-specified circuit design is implemented in dynamic region 204 and shown as user-specified circuitry 216. Dynamic region 204 may be reconfigured over time to implement different user-specified circuitry (e.g., circuits other than user-specified circuitry 216) while platform 218 in static region 202 continues to operate uninterrupted.

User-specified circuitry 216, for example, is capable of performing any of a variety of network acceleration functions. In this regard, the functionality of platform 218 and, e.g., NIC controller 208, though itself static, may be augmented through the addition of user-specified circuitry 216. In one aspect, user-specified circuitry 216 is capable of performing any of a variety of incremental network acceleration functions since NIC controller 208 is capable of passing metadata so that user-specified circuitry 216 need not repeat operations that have already been performed, e.g., by NIC controller 208.

User-specified circuitry 216 may be dynamically inserted, removed, and/or replaced in-line with data (e.g., data from the network 138 (referred to as "network" or "ingress" data) and/or data from the host system 100 (referred to as "host" or "egress" data)) flowing through platform 218 in static region 202 between network 138 and host system 100 during operation of programmable IC 132 without interruption or loss of such data. In another aspect, in the case of virtual machines executing in host system 100, the terms "egress" and "ingress" may be used relative to the virtual machines. For example, egress data of a virtual machine executing in host system 100 may be directed to network 138 or to the ingress of another virtual machine also executing in host system 100. In any case, platform 218 is capable of maintaining communication links with network 138 via Ethernet interface 206 and with host system 100 via PCIe controller 212 while dynamic region 204 is dynamically reconfigured. Thus, while dynamic region 204 is reconfigured, programmable IC 132 appears to be "online" or operational to host system 100 and other devices connecting to programmable IC 132 via network 138.

Though NIC controller 208 is shown to include one communication interface 214 in the example of FIG. 2, NIC controller 208 may include a plurality of different communication interfaces. The communication interfaces may be included in NIC controller 208 at one or more different stages included therein. This allows NIC controller 208 to exchange data with the user-specified circuitry 216 at any of a variety of different processing stages therein.

Figure 2B:
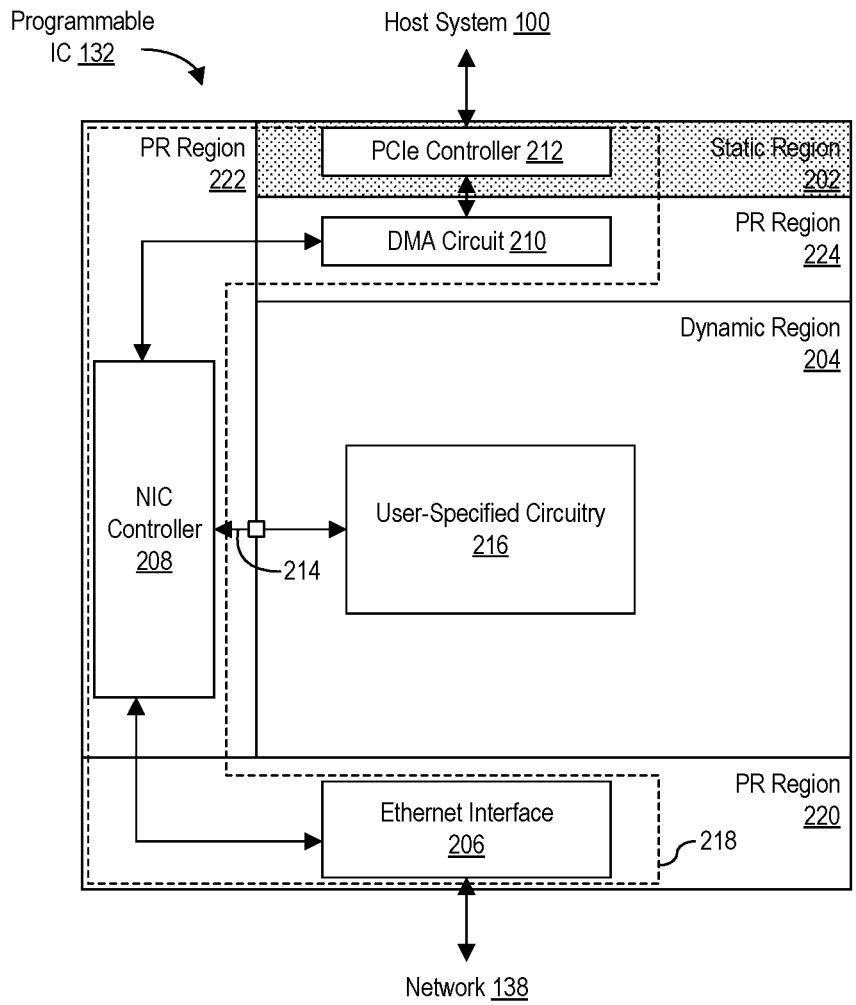
FIG. 2B illustrates another example platform implemented in a programmable IC.

FIG. 2B illustrates another example of platform 218 implemented in programmable IC 132 of FIG. 1. Platform 218 of FIG. 2B is substantially similar to the example of FIG. 2A. In the example of FIG. 2B, however, platform 218 is partially implemented in static region 202. For example, PCIe controller 212 is implemented in static region 202. Ethernet interface 206, NIC controller 208, and DMA circuit 210 each is implemented in a different PR region (e.g., PR regions 220, 222, and 224, respectively). In the example of FIG. 2B, dynamic region 204 may be implemented as another PR region that is separate and independent of PR regions 220, 222, and 224.

The example of FIG. 2B allows different components of platform 218 to be updated over time. In effect, platform 218 is configurable. Updates to circuitry in static region 202 typically require user circuitry to be recompiled. The implementation of FIG. 2B minimizes the portion of platform 218 that is implemented in static region 202. By minimizing the amount of platform 218 implemented in static region 202, the likelihood of having to recompile user-specified circuitry is reduced. For example, DMA circuit 210, NIC controller 208, and Ethernet interface 206 may be changed (the PR regions may be reconfigured with different implementations of such components) without requiring recompilation of user-specified circuitry 216. A change to PCIe controller 212 will require recompilation of user-specified circuitry 216. Recompiling user circuitry (e.g., user-specified circuitry 216) is a time-consuming endeavor that is undesirable and which may be particularly undesirable in FaaS applications. In the example of FIG. 2B, a large portion of platform 218 may be updated over time without requiring recompilation of user-specified circuitry. This reduces the likelihood of having to update circuitry in static region 202 and, as such, reduces the likelihood that user circuit designs will need to be recompiled.

FIG. 2B is provided for purposes of illustration. Other example implementations may use a different number of PR regions to implement platform 218. For example, platform 218 may implement PCIe controller 212 in static region 202 and implement Ethernet interface 206, NIC controller 208, and DMA circuit 210 in a single PR region. In another example, two PR regions may be used where any two of Ethernet interface 206, NIC controller 208, and DMA circuit 210 are implemented in a first PR region while the other component is implemented in a second PR region. It should be appreciated that while not specifically illustrated in the various example platforms 218 shown in the remaining figures, platform 218 may be implemented using one or more PR regions in each of the examples presented as described in connection with FIG. 2B.

Figure 3:
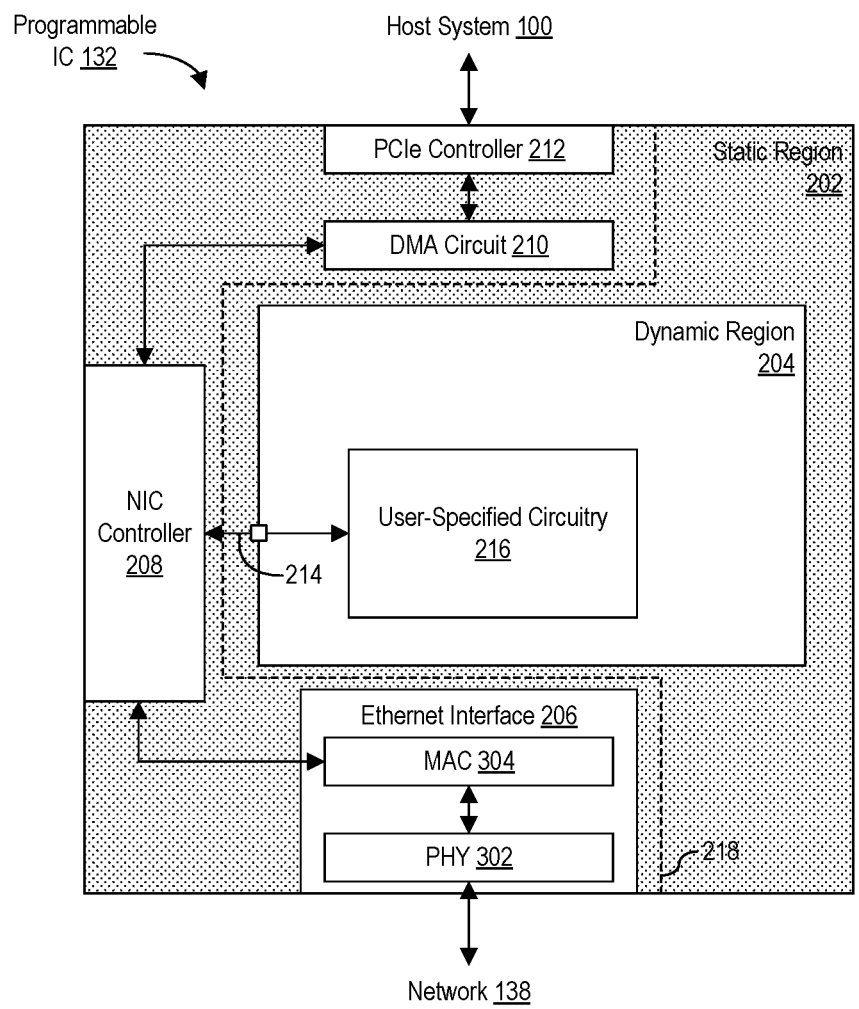
FIG. 3 illustrates another example platform implemented in a programmable IC.

FIG. 3 illustrates another example of platform 218 implemented in programmable IC 132. In the example of FIG. 3, Ethernet interface 206 is shown in greater detail. Ethernet interface 206 includes a physical layer (PHY) 302 connected to a Medium Access Control (MAC) 304. PHY 302 connects to network 138. MAC 304 connects to NIC controller 208. For example, MAC 304 may connect to an Ethernet interface (not shown) included in NIC controller 208.

Figure 4:
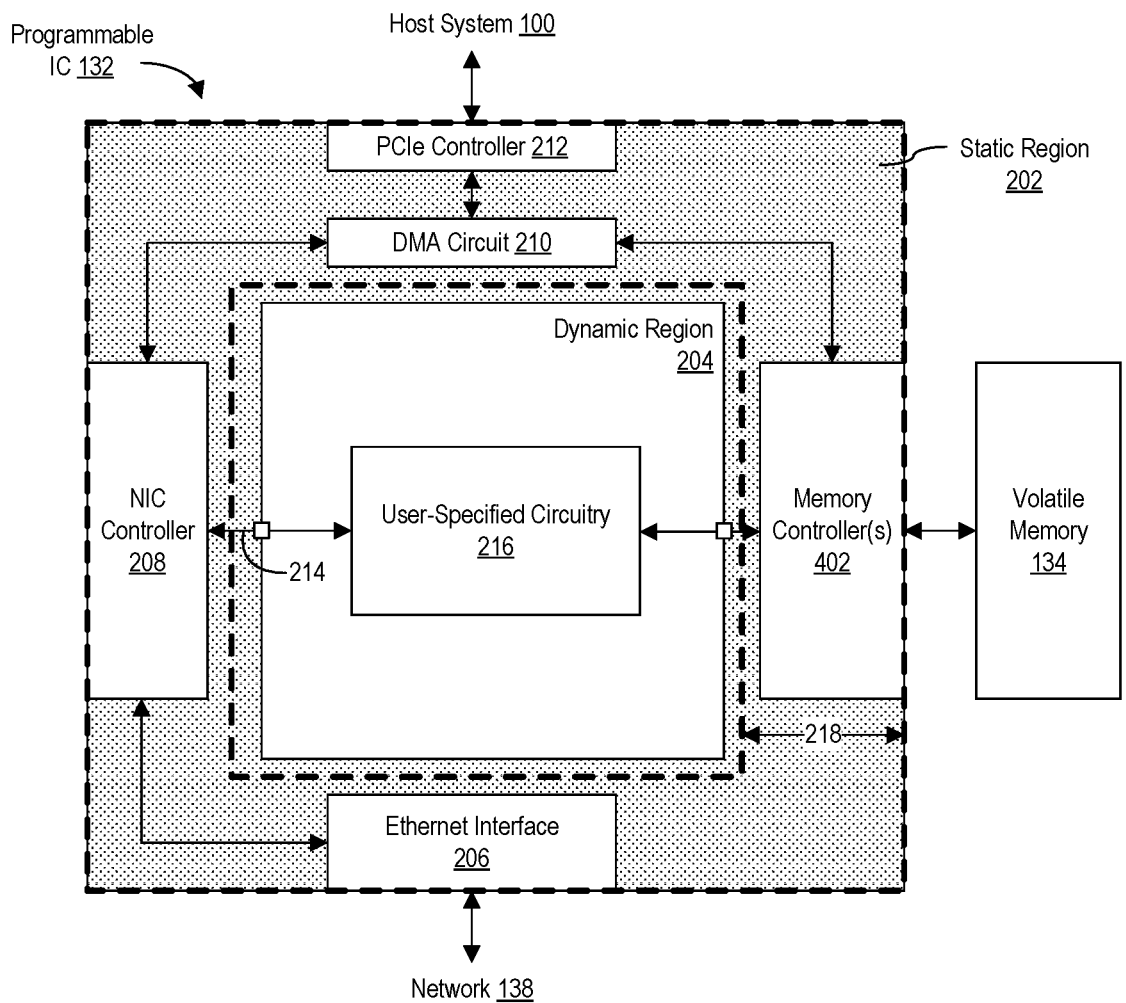
FIG. 4 illustrates another example platform implemented in a programmable IC.

FIG. 4 illustrates another example of platform 218 implemented in programmable IC 132. In the example of FIG. 4, one or more memory controllers 402 are implemented in static region 202 as part of platform 218. Memory controller(s) 402 are connected to volatile memory (e.g., RAM) 134. Memory controllers 402 may be implemented using programmable circuitry. In another example, however, one or more of memory controllers 402 may be implemented as hardwired circuit blocks.

Memory controllers 402 may be connected to user-specified circuitry 216 implemented in dynamic region 204. Further, memory controller(s) 402 may be coupled to DMA circuit 210. As such, user-specified circuitry 216 is capable of accessing volatile memory 134 during operation. Further, host system 100 is capable of reading and/or writing to volatile memory 134 via memory controller(s) 402. This allows host system 100 to share data with user-specified circuitry 216.

Within this disclosure, whether shown with memory controllers or not, the various example platforms shown may be implemented including one or more memory controllers. The memory controllers may be optionally included. Further, in implementations where platform 218 is implemented using one or more PR regions, the memory controllers may be implemented in their own PR region or included in another PR region with one or more other components of platform 218.

Figure 5:
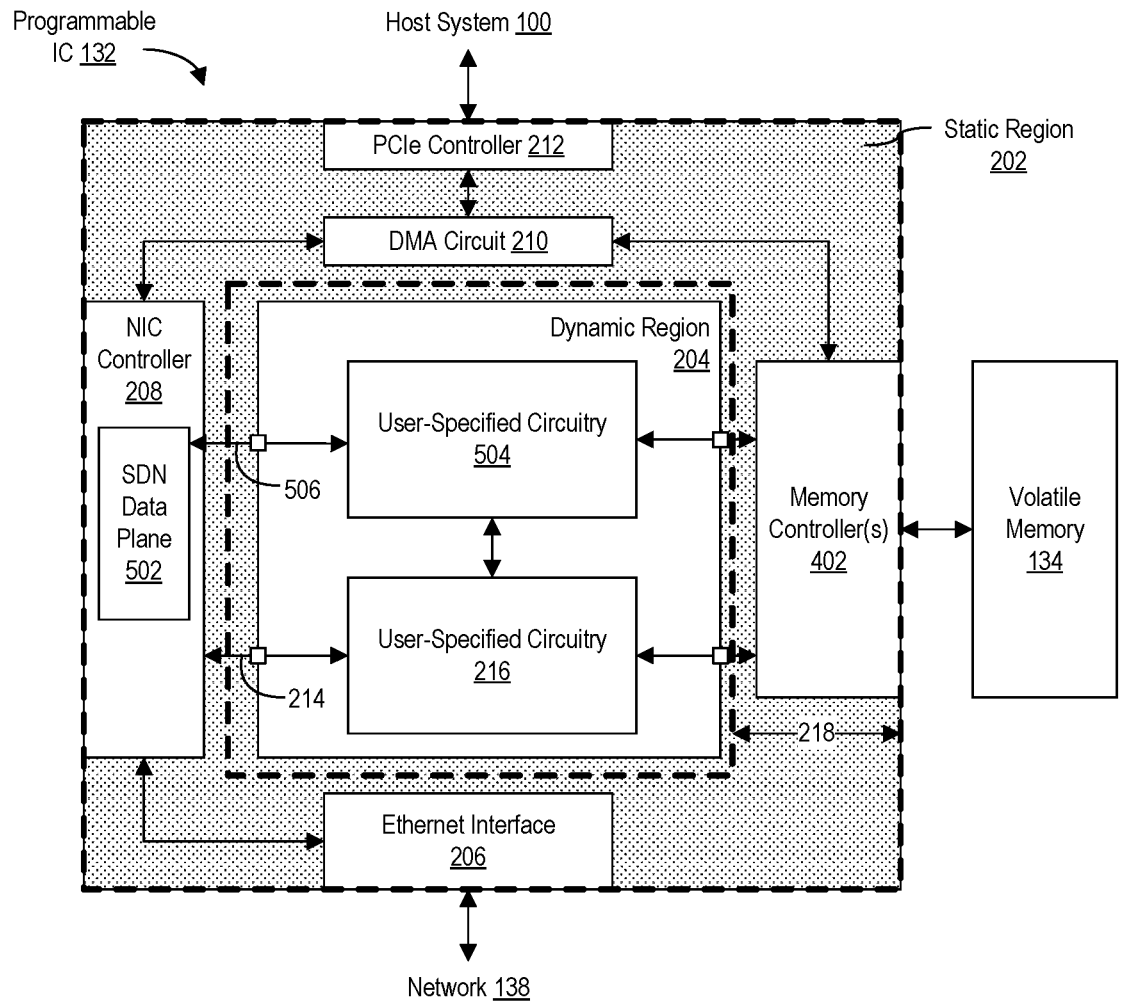
FIG. 5 illustrates another example platform implemented in a programmable IC.

FIG. 5 illustrates another example of platform 218 implemented in programmable IC 132. In the example of FIG. 5, platform 218 includes a Software-Defined Networking (SDN) data plane 502 implemented in NIC controller 208. SDN data plane 502 is capable of decoupling the data and the control planes by implementing the data plane as part of platform 218. In this example, rather than implementing the data plane in software executing in host system 100, the data plane software is hardware accelerated and implemented as SDN data plane 502 within NIC controller 208.

In some example implementations, SDN data plane 502 can be customized using user-specified circuitry 504 (and/or other user-specified circuitry in dynamic region 204 that is connected to SDN data plane 502 via communication interface 506). For example, with ports connecting SDN data plane 502 with dynamic region 204, user-specified circuitry 504 may be configured to add a custom GRE header to data and/or implement a custom parser. With a custom parser, for example, metadata may be passed along and associated with the new parser data. Further, the GREs may be modified, by way of user-specified circuitry 504, with network overlay(s). In any case, availability of one or more communication interfaces 506 allows SDN data plane 502 to be customized using programmable circuitry in dynamic region 204.

SDN data plane 502 enables programmatic access to make network administration more flexible. For example, to the extent that NIC controller 208 and/or SDN data plane 502 utilize a large flow table that is searched over the look-up interface, customized flow tables may be implemented as user-specified circuitry 216 and/or 504 within dynamic region 204. SDN data plane 502 alleviates the processing burden that would otherwise be placed on host system 100 to execute the data plane software.

In the example of FIG. 5, SDN data plane 502 may connect to dynamic region 204 via a communication interface 506. SDN data plane 502 may have more than one communication interface connected to dynamic region 204. In other examples, SDN data plan 502 may not include a communication interface to dynamic region 204. Though memory controller(s) 402 are shown, memory controller(s) 402 are optional and may be omitted. Memory controllers 402, when included, allow user-specified circuitry 504 and 214 to read and to write to volatile memory 134. Further, memory controller(s) 402 allow host system 100 to read from and write to volatile memory 134.

For purposes of illustration, dynamic region 204 includes additional user-specified circuitry 504. In one example, user-specified circuitry 504 connects to NIC controller 208 and/or to SDN data plane 502 via communication interface 506. User-specified circuitry 504 may implement a custom flow table that allows NIC controller 208 to implement data flow diversion.

In another example, user-specified circuitry 216 may implement a video decoder and scaling circuit. User-specified circuitry 504 may implement a machine learning object detection circuit. With this configuration, dynamic region 204 is capable of performing real-time video processing and machine learning. This example illustrates how network attached real-time video decode followed by object detection and/or classification may be implemented using platform 218.

For example, the video decoder and scaling circuit is capable of operating on multiple different video streams received via network 138. The video streams may originate from security systems and/or cameras communicatively linked to network 138. The video decoder and scaling circuit is capable of decoding the received video streams. The video decoder and scaling circuit is capable of extracting one or more individual frames from the different video streams and scaling the extracted frames for use by the machine learning object detection circuit.

In the example of FIG. 5, NIC controller 208 is capable of performing basic NIC functions. The video decode and scaling functions and the machine learning inference for object detection and/or image classification functions are implemented as hardware accelerated kernels within dynamic region 204. By implementing the functions as kernels in dynamic region 204, the kernels are capable of operating on the video streams in real-time. Real-time operation reduces latency since processing may be performed without the video streams traversing the networking stack of host system 100 (e.g., user-specified circuitry 504 and 216 operate on video prior to the data reaching host system 100). This accelerates processing performed by programmable IC 132. In addition, platform 218 reduces storage requirements since images without any flagged objects can be discarded while images (e.g., frames) with flagged objects can be saved for further analysis. Further, the workload placed on host system 100 is significantly reduced since cycles of processor(s) 106 can be used for other operations.

In another example, platform 218 of FIG. 5 may be used to perform inline malware detection on encrypted data traffic. In this example, platform 218 is capable of operating based on extracting certain information from data flows. The information may include the duration of the data flow, the number of packets sent from the client, the number of packets sent from the server, the number of bytes sent from the client, and the number of bytes sent from the server. For example, user-specified circuitry 216 may implement a classification and feature extraction circuit. The extracted information may be used with metadata from unencrypted portions of packet headers also extracted by user-specified circuitry 216 to train a random forest classifier implemented by user-specified circuitry 504. The trained classifier can then be used to detect malware.

In one aspect, the classifier may be run in real-time on packets coming into programmable IC 132 from network 138. User-specified circuitry 216 is capable of extracting features and classifying the packets into data flows. User-specified circuitry 216 is capable of feeding the determined information to user-specified circuitry 504. User-specified circuitry 504 may be preloaded with trained models for malware of interest. In response to user-specified circuitry 504 detecting malware, user-specified circuitry 504 is capable of sending a message to set up a filter within SDN data plane 502 to prevent any further network data sent from the attacker from reaching host system 100. In this example, NIC controller 208 and SDN data plane 502 run as part of platform 218, while feature extraction functions and classification for malware detection run as kernels that are loaded into dynamic region 204.

By performing the classification, extraction, and malware detection in real-time, malware can be blocked before the malware physically crosses the PCIe bus from programmable IC 132 to host system 100. This provides more robust protection for host system 100. The random forest classification technique allows detection of malware on encrypted traffic without requiring complex decryption and proxy techniques. In addition, performing this function on programmable IC 132 as opposed to an appliance provides better scaling through distribution of workload and protects against attacks from inside the data center.

The particular user-specified circuits described herein are provided for purposes of illustration and not limitation. The examples illustrate that any user-specified circuitry may be implemented in dynamic region 204 to extend the capabilities of platform 218. Further, while different blocks of user-specified circuitry can be included to communicate with NIC controller 208, the different blocks of user-specified circuitry may or may not communicate with one another.

In the example of FIG. 5, the dynamic region 204 is implemented as a single PR region. In one or more other examples, each user-specified circuit block (e.g., 504 and 216) may be implemented in its own independently reconfigurable PR region. In such configurations, the particular user-specified circuitry implemented in each PR region would be dynamically modifiable (e.g., reconfigurable) without modifying other user-specified circuitry implemented in dynamic region 204. For example, if user-specified circuitry 504 is in a first PR region and user-specified circuitry 216 is in a second PR region, user-specified circuitry 504 may be removed and different user specified circuitry added to the first PR region without disrupting operation of user-specified circuitry 216. Similarly, user-specified circuitry 216 may be removed and different user-specified circuitry added to the second PR region without disrupting operation of user-specified circuitry 504. In each case, platform 218 continues operating uninterrupted. Platform 218 of FIG. 5 may also be implemented using one or more PR regions as described herein.

Figure 6:
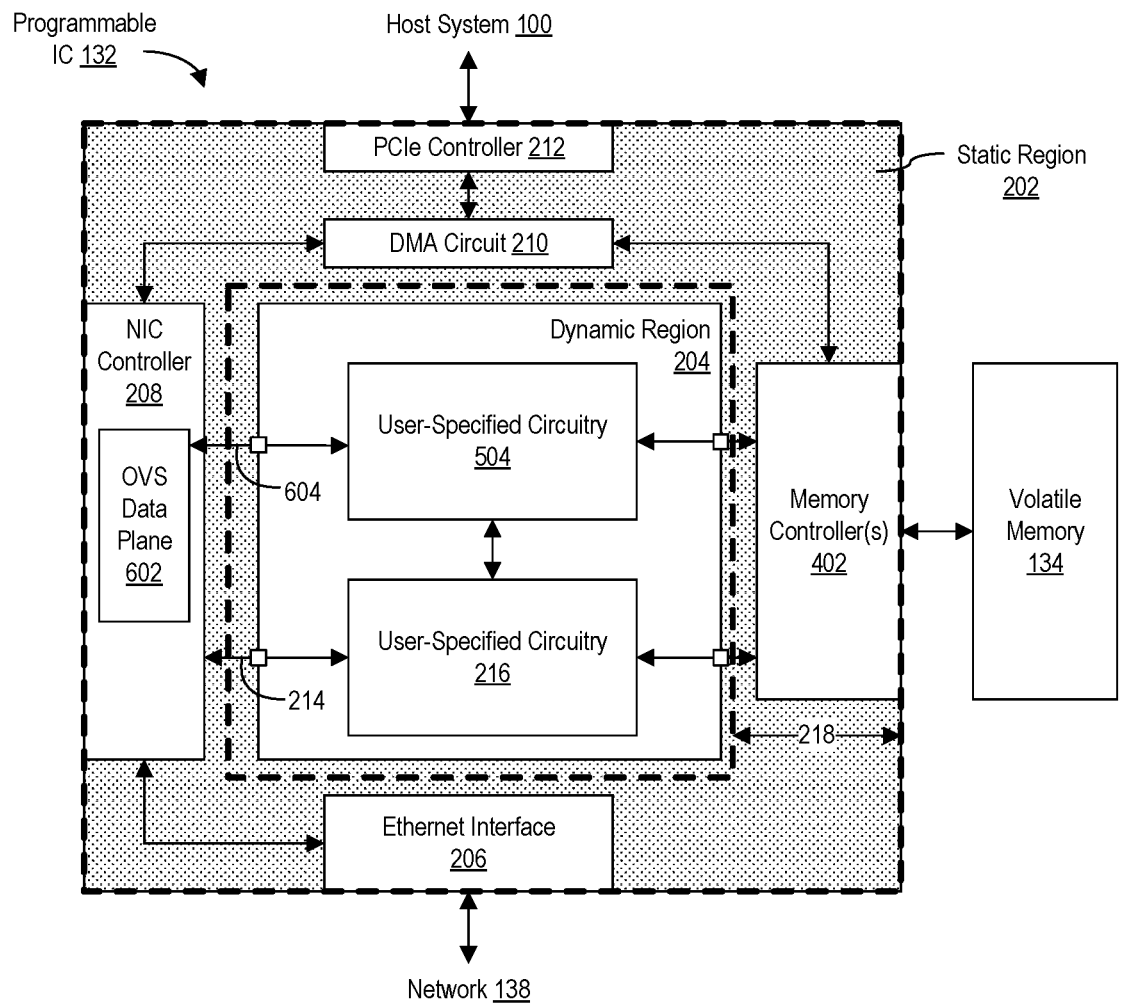
FIG. 6 illustrates another example platform implemented in a programmable IC.

FIG. 6 illustrates another example of platform 218 implemented in programmable IC 132. Platform 218 of FIG. 6 is substantially similar to example of FIG. 5. In the example of FIG. 6, however, the SDN data plane 502 is replaced with an Open Virtual Switch or Open vSwitch (OVS) data plane 602. OVS data plane 602 is capable of connecting to virtualized servers. OVS data plane 602 implements a hardware accelerated version of a virtual switch. Rather than implementing the virtual switch in software executing in host system 100, the virtual switch software is hardware accelerated and implemented as OVS data plane 602 within platform 218. OVS data plane 602 alleviates the processing burden that would otherwise be placed on host system 100. In the example of FIG. 6, OVS data plane 602 and/or a flow table may be customized using user-specified circuitry 504 and/or user-specified circuitry 216 (e.g., using user-specified circuitry implemented in dynamic region 204 and connected to OVS data plane 602 and/or NIC controller 208 via one or more communication interfaces).

In the example of FIG. 6, OVS data plane 602 is capable of connecting to dynamic region 204 via a communication interface 604. OVS data plane 602 may have more than one communication interface connected to dynamic region 204. In another example, OVS data plane 602 may not have a communication interface to dynamic region 204. Though memory controller(s) 402 are shown, memory controller(s) 402 are optional. Memory controllers 402, when included, allow user-specified circuitry 504 and 214 to read and write to volatile memory 134. Further, memory controller(s) 402 allow host system 100 to read and write to volatile memory 134.

For purposes of illustration, dynamic region 204 includes additional user-specified circuitry 504. User-specified circuitry 504 may connect to NIC controller 208 and/or OVS data plane 602 via interface 604. In one example, user-specified circuitry 216 may implement a circuit capable of performing one or more of storage compression, encryption, and/or deduplication operations.

In the example of FIG. 6, platform 218 may be used to implement a converged smart NIC for networking and storage. Platform 218 is capable of performing both network and storage offload and acceleration. Platform 218 provides NIC controller 208 having OVS data plane 602, Ethernet interface 206, PCIe controller 212, and memory controller(s) 402. User-specified circuitry 216 and 504 implemented in dynamic region 204 are capable of performing operations such as compression and/or encryption. As discussed, data flows between platform 218 and user-specified circuitry 216 and 504 may be implemented using, for example, stream interfaces.

The control plane and slow path processing may be performed in host system 100. In another example implementation, however, an embedded hardwired processor and/or soft-processor in programmable IC 132 (see, e.g., FIG. 7) or an externally connected processor (see, e.g., FIG. 8) other than the processor in host system 100 is capable of performing the storage offload. The latter model involving an embedded processor or an external processor may be used in "bare metal" implementations where the embedded or external processor manages the network function, storage, etc., as opposed to the host system processor performing such function(s).

The particular user-specified circuits described herein are provided for purposes of illustration and not limitation. The examples illustrate that any user-specified circuitry may be implemented in dynamic region 204 to extend the capabilities of platform 218. Further, the user-specified circuit blocks illustrated may be included in a same PR region or in different PR regions depending upon implementation. Similarly, platform 218 of FIG. 6 may be implemented using one or more PR regions as described herein.

Figure 7:
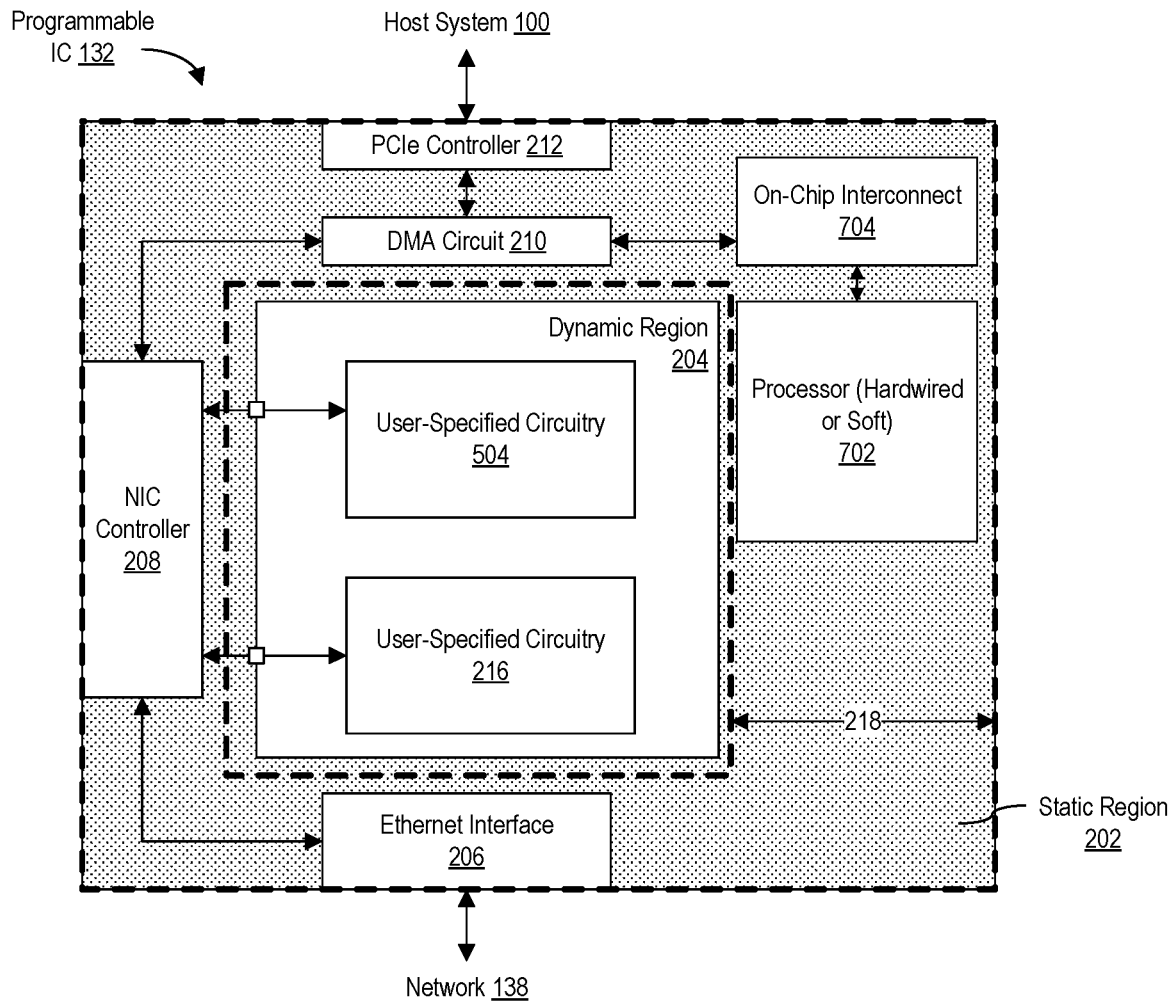
FIG. 7 illustrates another example platform implemented in a programmable IC.

FIG. 7 illustrates another example of platform 218 implemented in programmable IC 132. In the example of FIG. 7, static region 202 is implemented to include a processor 702. Processor 702 is an embedded processor within programmable IC 132. In one aspect, processor 702 is a soft-processor that is implemented using programmable circuitry of programmable IC 132. In an example implementation, soft-processor 702 is implemented as a MicroBlaze™ processor available from Xilinx, Inc. of San Jose, Calif. Still, processor 702 may be implemented as any of a variety of soft-processors capable of executing program code. In another example, processor 702 is a hardwired processor. For example, processor 702 may be implemented as an ARM-type of processor or an x86 type of processor.

As illustrated, processor 702 is connected to an on-chip interconnect 704. In one example, on-chip interconnect 704 is implemented as a memory-mapped interface. An example of a memory-mapped interface is a memory-mapped AXI interface. AXI is provided as an illustrative example of an interface and is not intended as a limitation of the inventive arrangements described within this disclosure. Other examples of on-chip interconnects include, but are not limited to, other types of buses, a network-on-chip, a crossbar, or other type of switch.

Processor 702 is capable of executing any of a variety of different functions. Examples of functions that may be performed by processor 702 include, but are not limited to, OVS control plane, storage, management, etc. In the example of FIG. 7, platform 218 is capable of passing network data from Ethernet interface 206 to embedded processor 702 via the local interfaces as shown (e.g., by way of NIC controller 208, DMA circuit 210, and memory-mapped interface 704).

In the example of FIG. 7, memory controller(s) are not included in platform 218. In one or more other examples, memory controller(s) may be included in platform 218. The memory controller(s) may be connected to processor 702, user-specified circuitry 216 and/or 504 in the dynamic region 204, and/or to the host system 100. As discussed, platform 218 may be implemented using one or more PR regions.

Figure 8:
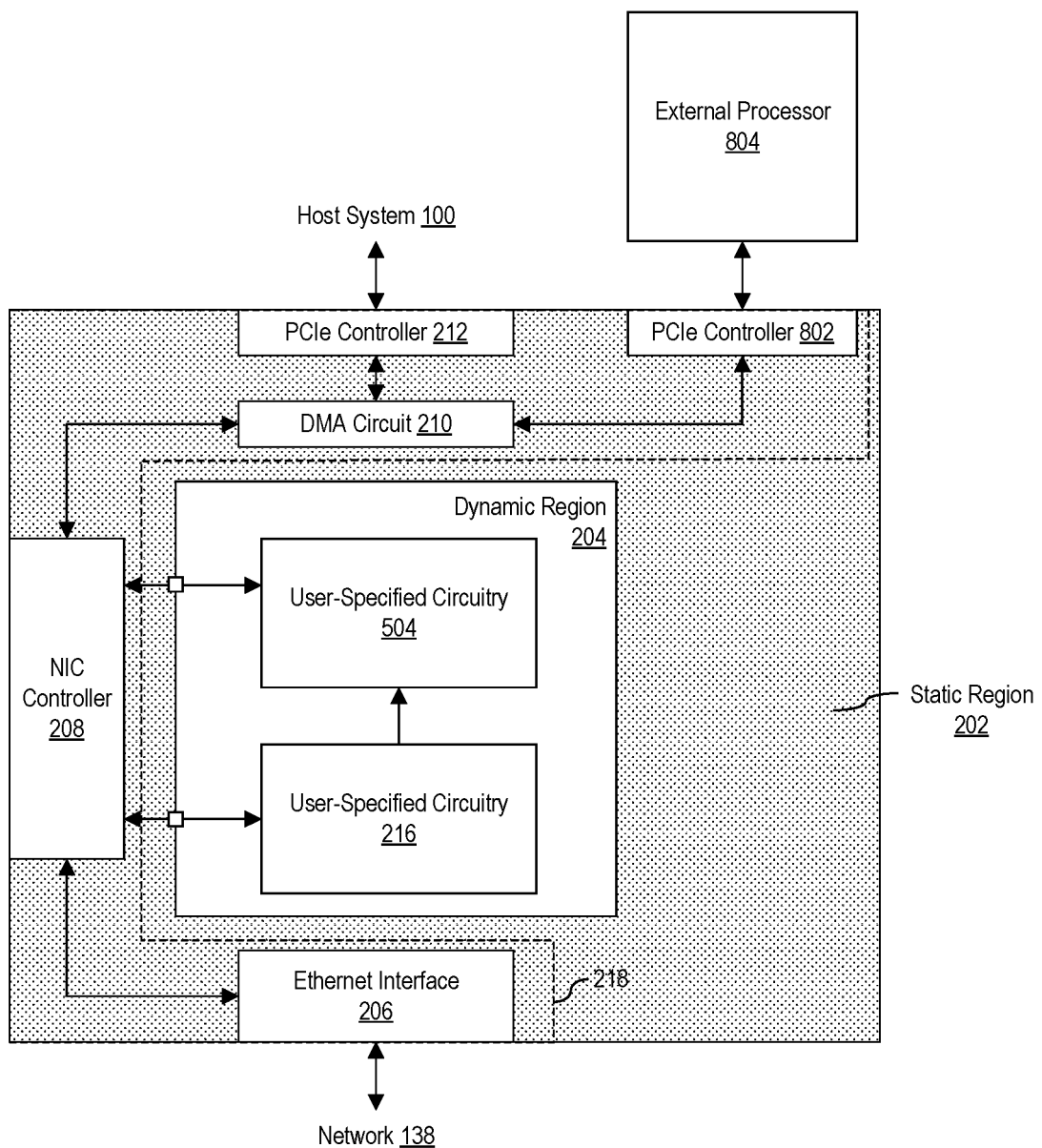
FIG. 8 illustrates another example platform implemented in a programmable IC.

FIG. 8 illustrates another example of platform 218 implemented in programmable IC 132. In the example of FIG. 8, platform 218 is implemented to include an additional (e.g., a second) PCIe controller 802. PCIe controller 802 is implemented using programmable circuitry. PCIe controller 802 is connected to an external processor 804. External processor 804 is capable of executing program code and may be disposed on hardware acceleration card 104 or on a different circuit board or system that is coupled to hardware accelerator card 104.

External processor 804 is capable of executing any of a variety of different functions. Examples of functions that may be performed by processor 804 include, but are not limited to, OVS control plane, storage, management, etc.

In the example of FIG. 8, memory controller(s) are not included in the static region 202. In one or more other examples, memory controller(s) may be included in platform 218. The memory controller(s) may be connected to DMA circuit 210, user-specified circuitry 216 and/or 504 in dynamic region 204, and/or to host system 100. As discussed, platform 218 may be implemented using one or more PR regions. In one aspect, PCIe controller 212 and PCIe controller 802 may be implemented in static region 202 while the other components are included in one or more PR regions.

Referring to the example implementations of FIGS. 7 and 8, the host system may implement one or more virtual machines. Each virtual machine has two separate virtual interfaces. One virtual interface is for networking and the other virtual interface is for storage. The network traffic is attached to a multi-queue DMA interface and goes through a processing pipeline that includes network offloads such as Receive Side Scaling (RSS), LSO/TSO (Large Send Offload/TCP Segmentation Offload), Virtual Extensible (VX) Lan/NVGRE (Network Virtualization using Generic Routing Encapsulation) tunnel offloads, and SDN match/action processing such as OVS. The storage traffic is offloaded through embedded processor 702 or external processor 804 that is optionally programmed with RDMA capabilities. The storage traffic may traverse through a processing pipeline that includes NVMe and storage offloaded operations such as compression and/or encryption performed in dynamic region 204. The processed data may then merge with the data pipeline of NIC controller 208.

Figure 9:
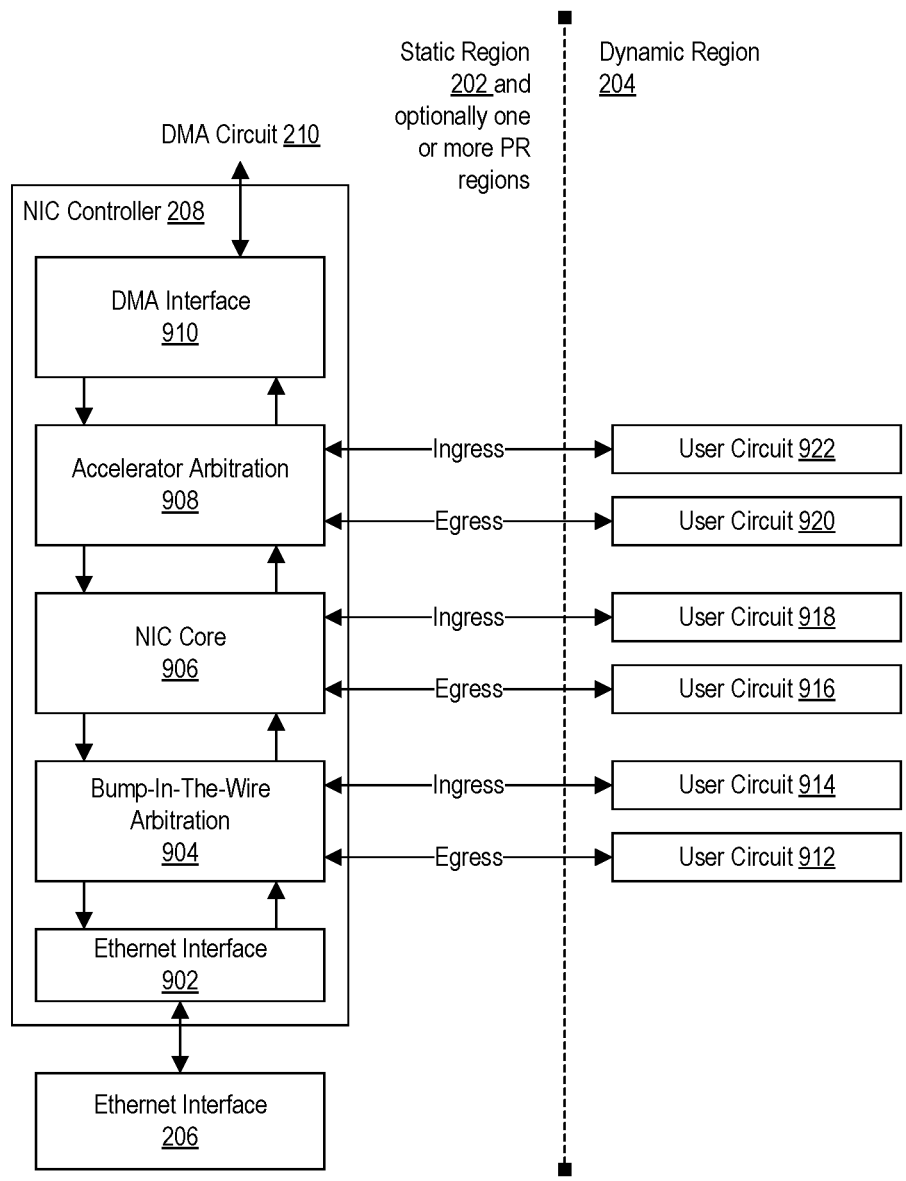
FIG. 9 illustrates an example implementation of a Network Interface Card (NIC) controller within a platform.

FIG. 9 illustrates an example implementation of NIC controller 208. In the example of FIG. 9, NIC controller 208 includes an Ethernet interface 902, a bump-in-the-wire (BITW) arbitration circuit 904, a NIC core 906, an accelerator arbitration circuit 908, and a DMA interface 910. For purposes of illustration and discussion, NIC core 906 and accelerator arbitration circuit 908 each may be referred to as a "stage" of NIC controller 208. In some example implementations, NIC core 906 may itself be formed of, or include, a plurality of different stages of circuitry.

In the example of FIG. 9, Ethernet interface 902 is connected to the Ethernet interface 206 (e.g., MAC 304). DMA interface 910 is connected to DMA circuit 210. DMA interface 910, accelerator arbitration circuit 908, NIC core 906, BITW arbitration circuit 904, and Ethernet interface 902 each supports ingress data flows (e.g., data flows into the NIC controller 208 from the Ethernet interface 206) and egress data flows (e.g., data flows out from the NIC controller 208 to the Ethernet interface 206).

As pictured, each of BITW arbitration circuit 904, NIC core 906, accelerator arbitration circuit 908, and DMA interface 910 includes an ingress communication interface to dynamic region 204 and an egress communication interface to dynamic region 204. In one aspect, a communication interface may include an ingress communication interface and an egress communication interface. For example, referring to FIG. 9, each ingress/egress pair may represent one communication interface. In other examples, however, a communication interface may include only ingress communication interface(s) or only egress communication interface(s). Each of the circuit blocks described as having a communication interface or interfaces to dynamic region 204 is capable of sending egress data and/or ingress data for further processing within any of the various user-circuits 912, 914, 916, 918, 920, and/or 922 illustrated in dynamic region 204 via the appropriate ingress or egress communication interfaces.

In another example implementation, BITW arbitration circuit 904 may be implemented as one or more multiplexers (e.g., switches) that connect the ingress and/or egress data paths to dynamic region 204. BITW arbitration circuit 904 allows NIC controller 208 to include one or more interfaces between Ethernet interface 902 and NIC core 906. BITW arbitration circuit 904 is capable of sending data received from the Ethernet interface 902 directly to one or more user circuits such as user circuit 914 via the ingress communication interface for packet processing. User circuit 914 is capable of performing packet processing on the received data and providing the processed data back to the BITW arbitration circuit 904 via the ingress communication interface. The BITW arbitration circuit 904 may then forward the processed data to the NIC controller core 906.

In particular implementations, BITW arbitration circuit 904 may be configured to turn data around. For example, BITW arbitration circuit 904 can receive data from Ethernet interface 902 and send the data back to Ethernet interface 902 to be output to Ethernet interface 206. BITW arbitration circuit 904 may or may not provide the data to user circuitry in dynamic region 204 prior to turning the data around. In any case, data received by NIC controller 208 from network 138 may be optionally processed, turned around, and sent back out of NIC controller 208 to network 138 using BITW arbitration circuit 904.

BITW arbitration circuit 904 is further capable of sending data received from NIC core 906 directly to one or more user circuits such as user circuit 912 via the egress communication interface for packet processing. User circuit 912 is capable of performing packet processing on the received data and providing the processed data back to the BITW arbitration circuit 904 via the egress communication interface. BITW arbitration circuit 904 may then forward the processed data to Ethernet interface 902. In another example, with sufficient data exchanged between user circuit 912 and/or user circuit 914 via BITW arbitration 904, NIC core 906 is capable of performing operations such as parsing of subsequent higher protocol layers.

In particular implementations, BITW arbitration circuit 904 may be configured to turn data around. For example, BITW arbitration circuit 904 can receive data from NIC controller 906 and send the data back to NIC controller 906 to be output to DMA circuit 210. BITW arbitration circuit 904 may or may not provide the data to user circuitry in dynamic region 204 prior to turning the data around. In any case, data received by NIC controller 208 from the host system may be optionally processed, turned around, and sent back out of NIC controller 208 to the host system using BITW arbitration circuit 904.

As such, BITW arbitration circuit 904 services as a switch or interface where ingress data may be provided to user-specified circuitry in dynamic region 204 prior to entering a processing stage of NIC controller 208. Similarly, BITW arbitration circuit 904 services as a switch or interface where egress data may be provided to user-specified circuitry in dynamic region 204 immediately prior to exiting NIC controller 208. As discussed, BITW arbitration circuit 904 may also turn ingress and/or egress data around.

In one aspect, the ingress and egress communication interfaces are implemented as stream interfaces. In one example implementation, user circuit 912 and user circuit 914 may implement Internet Protocol Security (IPSec) circuit blocks. For example, after processing by user circuit 914, ingress packets directed to NIC core 906 may be fully decrypted so that higher layer protocols such as Transmission Control Protocol (TCP) can be further processed. Unencrypted egress packets (e.g., plain text) from NIC core 906 may be encrypted by user circuit 912.

In another aspect, user circuit 912 is capable of performing operations such as adding an Ethernet IP and TCP header or a GRE. User circuit 914 may be used to implement GRE header removal, which is also known as decapsulation. User circuit 912 is capable of performing insertion of GRE headers also known as encapsulation. Again, user circuits 912 and/or 914 are capable of performing operations on data at a point in the data path between Ethernet interface 206 and NIC core 906.

NIC core 906 is capable of sending data received from BITW arbitration circuit 904 directly to one or more user circuits such as user circuit 918 via the ingress communication interface for packet processing. User circuit 918 is capable of performing packet processing on the received data and providing the processed data back to NIC core 906 via the ingress communication interface. NIC core 906 may then forward the processed data to acceleration arbitration circuit 908.

NIC core 906 is capable of sending data received from acceleration arbitration circuit 908 directly to one or more user circuits such as user circuit 916 via the egress communication interface for packet processing. User circuit 916 is capable of performing packet processing on the received data and providing the processed data back to NIC core 906 via the egress communication interface. NIC core 906 may then forward the processed data to BITW arbitration circuit 904.

In one aspect, the ingress and egress communication interfaces for NIC core 906 are implemented as Ternary Content Addressable Memory (TCAM) interfaces (e.g., at least one for ingress and at least one for egress). User circuit 916 and/or user circuit 918 may implement any of a variety of different circuits including, but not limited to, an access control list/flow table, an algorithmic TCAM, a MAC filter, and/or an algorithmic Content Addressable Memory (CAM).

In another example, in the case of video processing, operations such as the UDP and checksum offload may be performed by NIC core 906. User circuit(s) 918 and/or 916 may be used to perform a flow look up to identify where the data should be directed. The data may be directed wherever user circuits 918 and/or 916, which implement flow tables, indicate. For example, a user may wish to use a larger table than may be implemented in NIC core 906. As such, user circuit(s) 918 and/or 916 may use additional RAM in dynamic region 202 to extend the table included in NIC core 906.

Acceleration arbitration circuit 908 is capable of sending data received from NIC core 906 directly to one or more user circuits such as user circuit 922 via the ingress communication interface for packet processing. User circuit 922 is capable of performing packet processing on the received data and providing the processed data back to acceleration arbitration circuit 908 via the ingress communication interface. Acceleration arbitration circuit 908 may then forward the processed data to DMA interface 910.

Acceleration arbitration circuit 908 is capable of sending data received from DMA interface 910 directly to one or more user circuits such as user circuit 920 via the egress communication interface for packet processing. User circuit 920 is capable of performing packet processing on the received data and providing the processed data back to acceleration arbitration circuit 908 via the egress communication interface. Acceleration arbitration circuit 908 may then forward the processed data to NIC core 906.

In an example implementation, accelerator arbitration circuit 908 is located in the data path subsequent to TCP/IP, checksum offload, and other high-level functionality have been performed. Packets and associated metadata can be passed to dynamic region 202 where user circuits (e.g., user circuits 920 and/or 922) are capable of performing incremental acceleration. That is, if the user circuits 920 and/or 922 are performing high-level operations, the circuitry does not need to perform prior operations performed elsewhere in the data pipeline of NIC controller 208 anew.

In one aspect, the ingress and egress communication interfaces are implemented as stream interfaces (e.g., at least one for ingress and at least one for egress). In an example implementation, user circuit 920 and user circuit 922 may implement circuits for performing Layer 4 and above deep packet inspection.

DMA interface 910 is capable of sending data received from acceleration arbitration circuit 908 to DMA circuit 210. DMA interface 910 is capable of sending data received from DMA circuit 210 to accelerator arbitration circuit 908.

In the example of FIG. 9, the user circuits are shown as being implemented in a single PR region. It should be appreciated that two or more PR regions may be implemented in dynamic region 204 that include various combinations of user circuits. In another example, user circuits 912 and 914 are implemented in one PR region; user circuits 916 and 918 are implemented in another PR region; and user circuits 920 and 922 are implemented in yet another PR region. Further, the various examples of different user circuits and interfaces are intended for purposes of illustration and not limitation. In another example, each user circuit may be implemented in a different PR region.

As illustrated in the example of FIG. 9, platform 218 is capable of providing a plurality of different communication interfaces into dynamic region 204. These communication interfaces, e.g., connection points, allow data to move between the platform 218 and dynamically loaded functions implemented in dynamic region 204 at any of the various connection points that are supported. As noted, one or more or all of the communication interfaces described connecting platform 218 to dynamic region 204 (e.g., the communication interfaces of NIC controller 208) are software controllable. As such, an embedded processor in programmable IC 132 (whether soft or hardwired as shown in FIG. 7) or an external device or processor (e.g., as shown in FIG. 8), and/or the processor of the host system, is capable of controlling, on an individual basis, whether each of the communication interfaces is turned on to exchange data between static platform 218 and dynamic region 204 or turned off to prevent exchange of data between platform 218 and dynamic region 204.

Figure 10:
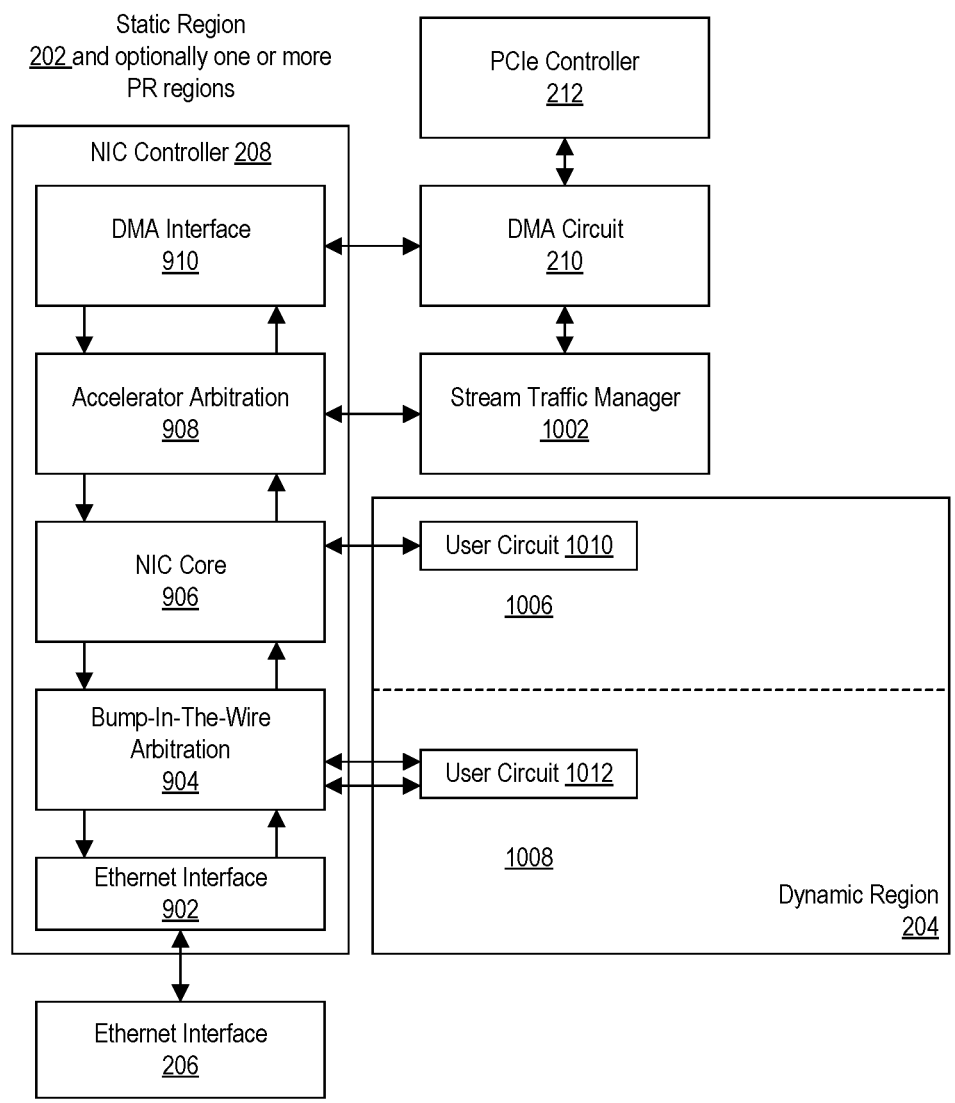
FIG. 10 illustrates another example platform implemented in a programmable IC.

FIG. 10 illustrates another example of platform 218 implemented in programmable IC 132. In the example of FIG. 10, platform 218 includes a stream traffic manager 1002. Stream traffic manager 1002 is connected to accelerator arbitration circuit 908 and to DMA circuit 210. Though not illustrated in FIG. 10, stream traffic manager 1002 may include one or more connections to dynamic region 204.

Stream traffic manager 1002 is capable of regulating the flow of data streams/packets between host system 100 and circuits implemented in dynamic region 204. In the example of FIG. 10, stream traffic manager 1002 regulates the flow of data between the host system 100 and user circuit 1010 and/or user circuit 1012. In other examples, dynamic region 204 may include additional user circuits, e.g., kernel circuits, that may be connected to stream traffic manager 1002 via an interconnect (not shown).

In the example of FIG. 10, dynamic region 204 is divided into PR regions 1006 and 1008. PR region 1006 includes user circuit 1010. PR region 1008 includes user circuit 1012. Each of PR regions 1006 and 1008 may be dynamically reconfigured independently of the other. Thus, since user circuit 1010 is in PR region 1006 while user circuit 1012 is in PR region 1008, user circuit 1010 may be removed or replaced without affecting operation of user circuit 1012 or platform 218. Similarly, since user circuit 1012 is implemented in PR region 1008, user circuit 1012 may be removed or replaced without affecting operation of user circuit 1010 or platform 218. As discussed, one or both PR regions 1006, 1008 (e.g., the entirety of dynamic region 204) can be reconfigured without interrupting operation of platform 218. It should be appreciated that while dynamic region 204 is shown to include two PR regions, in another example, user circuit 1010 and user circuit 1012 may be implemented in a single PR region.

In one aspect, user circuit 1006 implements an algorithmic TCAM that is capable of performing high-speed packet processing. User circuit 1010 implements an IPSec circuit capable of performing operations between two communication points across an IP network including, but not limited to, data authentication, integrity, and/or confidentiality.

In the example of FIG. 10, user circuit 1010 is capable of receiving data from NIC core 906, processing the data, and providing the processed data back to NIC core 906. User circuit 1012 illustrates an example where user circuit 1012 (e.g., an IPSec circuit) may be programmed by host system 100. In this case, host system 100 (e.g., or another trusted processor whether internal or external) is capable of sending post configuration data to user circuit 1012 by way of PCIe controller 212 and a control interface of user circuit 1012 coupled thereto. An example of a control interface is one compliant with the AXI-Light protocol, though other control interfaces may be used.

Figure 11:
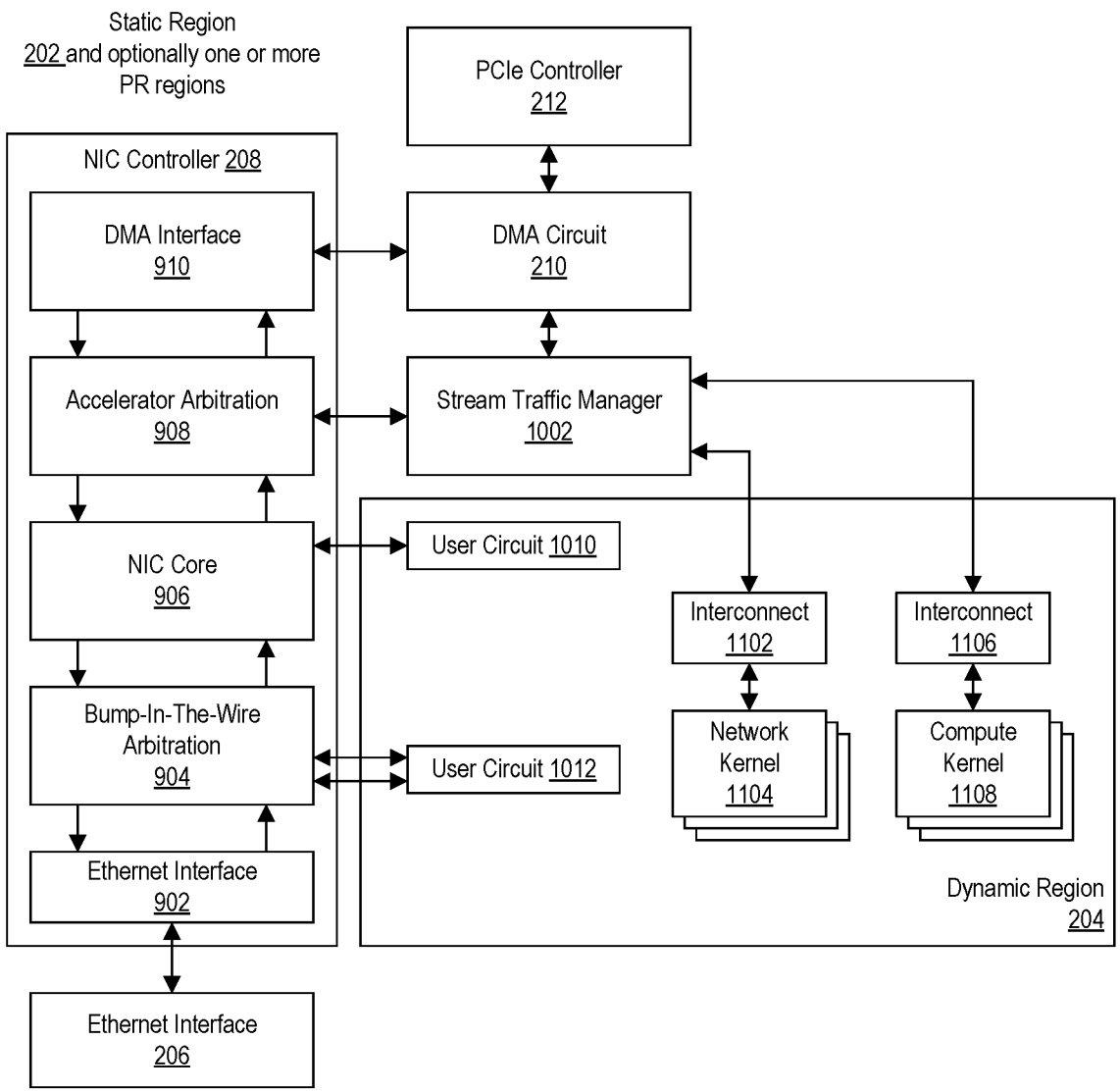
FIG. 11 illustrates another example platform implemented in a programmable IC.

FIG. 11 illustrates another example of platform 218 implemented in programmable IC 132. In the example of FIG. 11, stream traffic manager 1002 is connected to an interconnect 1102 and to an interconnect 1106 in dynamic region 204. Interconnect 1102 may be a memory-mapped interconnect while interconnect 1106 may be a stream interconnect. Interconnect 1102 is connected to one or more network kernels 1104. Interconnect 1106 is connected to one or more compute kernels 1108. Stream traffic manager 1002 and/or accelerator arbitration 908 is capable of managing data flows (e.g., directing data flows) between host system 100 and network kernels 1104 and compute kernels 1108. In the example of FIG. 11, accelerator arbitration circuit 908 is capable of communicating with user circuitry implemented in dynamic region 204 via stream traffic manager 1002.

Though dynamic region 204 is shown as including a single PR region, in another aspect, dynamic region 204 may include a plurality of PR regions. For example, user circuit 1012 may be implemented in a first PR region while user circuit 1010 is implemented in a second PR region. Further, interconnects 1102, 1106 and network kernels 1104, 1108 may be implemented in a third PR region. In another aspect, interconnect 1102 and network kernel(s) 1104 are implemented in a third PR region, while interconnect 1106 and network kernel(s) 1108 are implemented in a fourth PR region. In the examples of FIGS. 10 and 11, stream traffic manager 1002 may be implemented in a PR region by itself or within a PR region with one or more other components of platform 218. Alternatively, stream traffic manager 1002 may be implemented static region 202.

Using stream traffic manager 1002, which may operate at least in part as a switch, data from the host system may be routed to interconnect 1102 and on to one or more network kernels 1104, to interconnect 1106 and on to one or more compute kernels 1108, or to NIC controller 208 via accelerator arbitration 908. For example, stream traffic manager 1002 may receive packets with a specified flow (e.g., route or destination). Stream traffic manager 1002 is capable of identifying the flow for the received packets and distributing the packets to the destination corresponding to the identified flow. This allows dynamic region 204 to perform compute functions (e.g., hardware acceleration of tasks offloaded from host system 100) and perform network functions simultaneously.

As another example, the architecture illustrated in FIG. 11 allows data (e.g., packets) to flow from the host system 100 to dynamic region 204 for processing (e.g., by compute kernel(s) and/or network kernels(s)) and back to host system 100 or from host system 100 to dynamic region 204 for processing (e.g., by compute kernel(s) and/or network kernel(s)) and out to Ethernet by way of NIC controller 208, where NIC controller 208 may or may not further process the data using dynamic region 204 (e.g., user circuit 1010 and/or 1012). Thus, host system 100 can send data to dynamic region 204 (e.g., compute kernel 1108) for processing. Stream traffic manager 1002 may determine whether to send the resulting data output from dynamic region 204 back to host system 100 or to NIC controller 208.

Though not illustrated in FIG. 11, in another example, data may be exchanged directly between a compute kernel and a network kernel (or user circuit connected to NIC controller 208).

Figure 12:
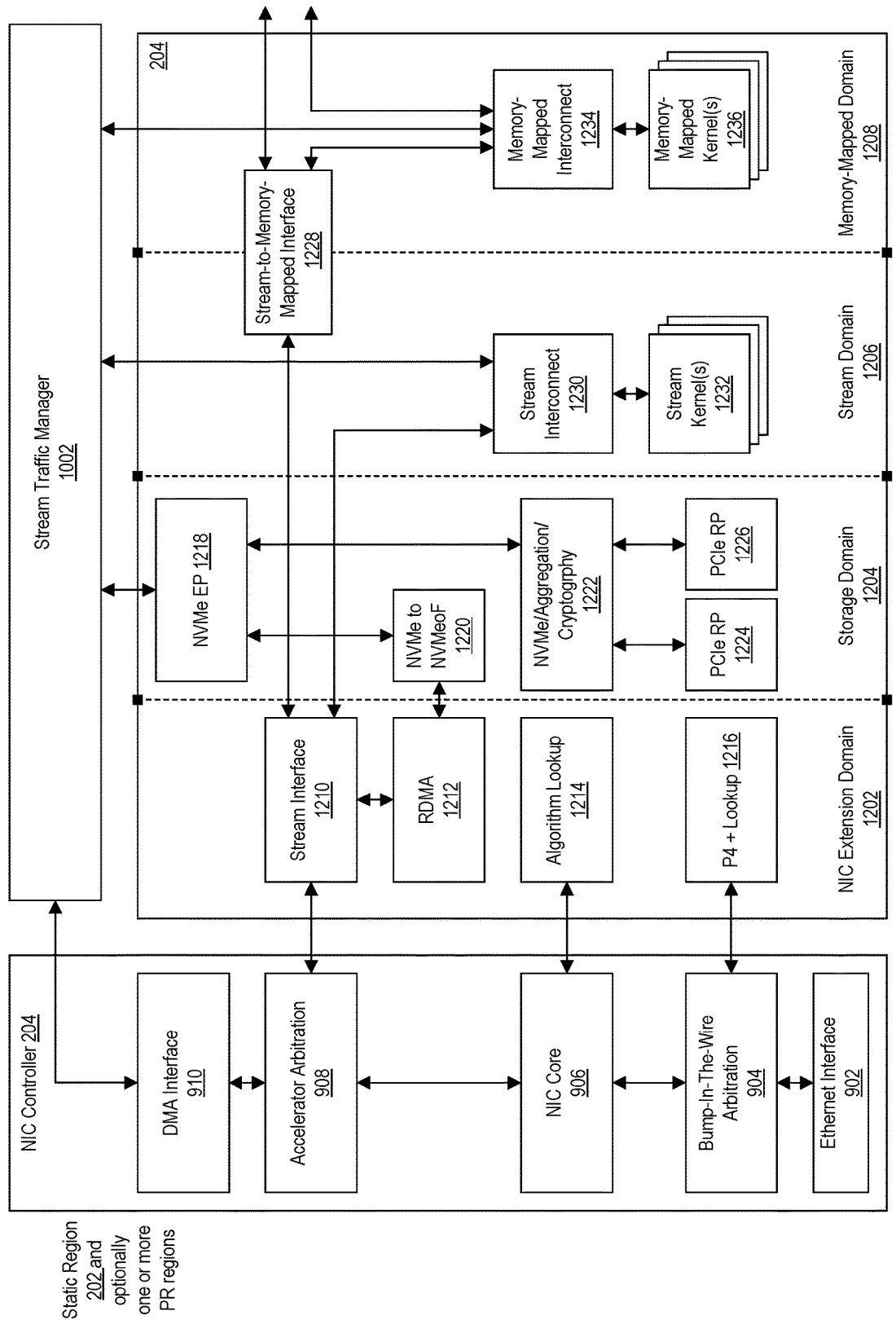
FIG. 12 illustrates another example platform implemented in a programmable IC.

FIG. 12 illustrates another example platform implemented in programmable IC 132. In the example of FIG. 12, a portion of the static region 202 is shown including NIC controller 208 and stream traffic manager 1002. Other elements of static region 202 are not shown for ease of illustration. Further, communication interfaces between components of NIC controller 208 are shown more generally as opposed to illustrating separate ingress and egress communication interfaces.

The architecture shown in FIG. 12 is intended for purposes of illustration to show more complex and powerful processing that may be used to extend capabilities of platform 218 and NIC controller 208. In the example, dynamic region 204 is subdivided into a plurality of domains. Each domain is dedicated to a particular functionality. For example, the dynamic region 202 includes a NIC extension domain 1202, a storage domain 1204, a stream domain 1206, and a memory-mapped domain 1208. In one aspect, each domain is implemented as a different PR region.

NIC extension domain 1202 may include a stream interface 1210 connected to acceleration arbitration circuit 908. The stream interface 1210 is connected to an RDMA circuit 1212. Stream interface 1210 is further connected to stream interconnect 1230 in the stream domain 1206 and to the stream-to-memory-mapped interface 1228. Stream-to-memory-mapped interface 1228 bridges domains 1206 and 1208. For example, the stream-to-memory map circuitry of interface 1228 may be located in domain 1206, while the memory-map to stream circuitry of interface 1228 may be located in domain 1208. NIC extension domain 1202 further includes an algorithm lookup circuit 1214 connected to NIC core 906 and a Layer 4 processing and lookup circuit 1216 connected to BITW interface 904.

The storage domain 1204 includes an NVMe EP 1218 connected to stream traffic manager 1002. NVMe EP 1218 further connects to NVMe to NVMeoF 1220 and to the NVMe/Aggregation/Cryptography circuit 1222. NVMe to NVMeoF 1220 further connects to the RDMA 1212 of NIC extension domain 1202. The NVMe/Aggregation/Cryptography circuit 1222 connects to a PCIe RP 1224 and a PCIe 1226 also included in storage domain 1204. PCIe RPs 1224 and 1226 are capable of connecting to external non-volatile storage (e.g., non-volatile storage 136 such as SSDs).

Stream domain 1206 includes stream interconnect 1230, which is connected to stream traffic manager 1002. Stream domain 1206 also includes one or more stream kernel(s) 1232 connected to stream interconnect 1230. Memory-mapped domain 1208 includes a memory-mapped interconnect 1234, which is connected to stream traffic manger 1002. Memory-mapped domain 1208 further includes one or more memory-mapped kernel(s) 1236 connected to the memory-mapped interconnect 1234. Memory-mapped interconnect 1234 may be connected to one or more external DDR memories (e.g., volatile memory 134) through one or more memory controllers (not shown). Stream-to-memory-mapped interface 1228 is also capable of connecting to one or more external DDR memories (e.g., volatile memory 134) through one or more memory controllers (also not shown).

FIG. 12 is provided for purposes of illustration and not limitation. In other examples, one or more or any combination of the domains may be implemented at any given time in dynamic region 202. Further, particular domains may be added and/or removed during operation of programmable IC 132 as needed using dynamic partial reconfiguration.

For example, once the platform is implemented in programmable IC 132, a first partial configuration bitstream may be loaded into the programmable IC 132 to configure the dynamic region 202 to include only stream domain 1206 and memory-mapped domain 1208. At another time, a second partial configuration bitstream may be loaded into programmable IC 132 to configure dynamic region 202 to implement storage domain 1204, stream domain 1206, and memory-mapped domain 1208. At another time, a third partial configuration bitstream may be loaded into the programmable IC 132 to configure dynamic region 202 to implement NIC extension domain 1202, storage domain 1204, stream domain 1206, and memory-mapped domain 1208.

In another aspect, each domain is implemented as a different PR region. A such, the circuitry implemented in each respective domain may be changed over time without disrupting the circuitry in the other domains. In cases where domains interface with one another, data flows may be temporarily halted until such time that the connecting PR region has finished undergoing partial reconfiguration.

Figure 13:
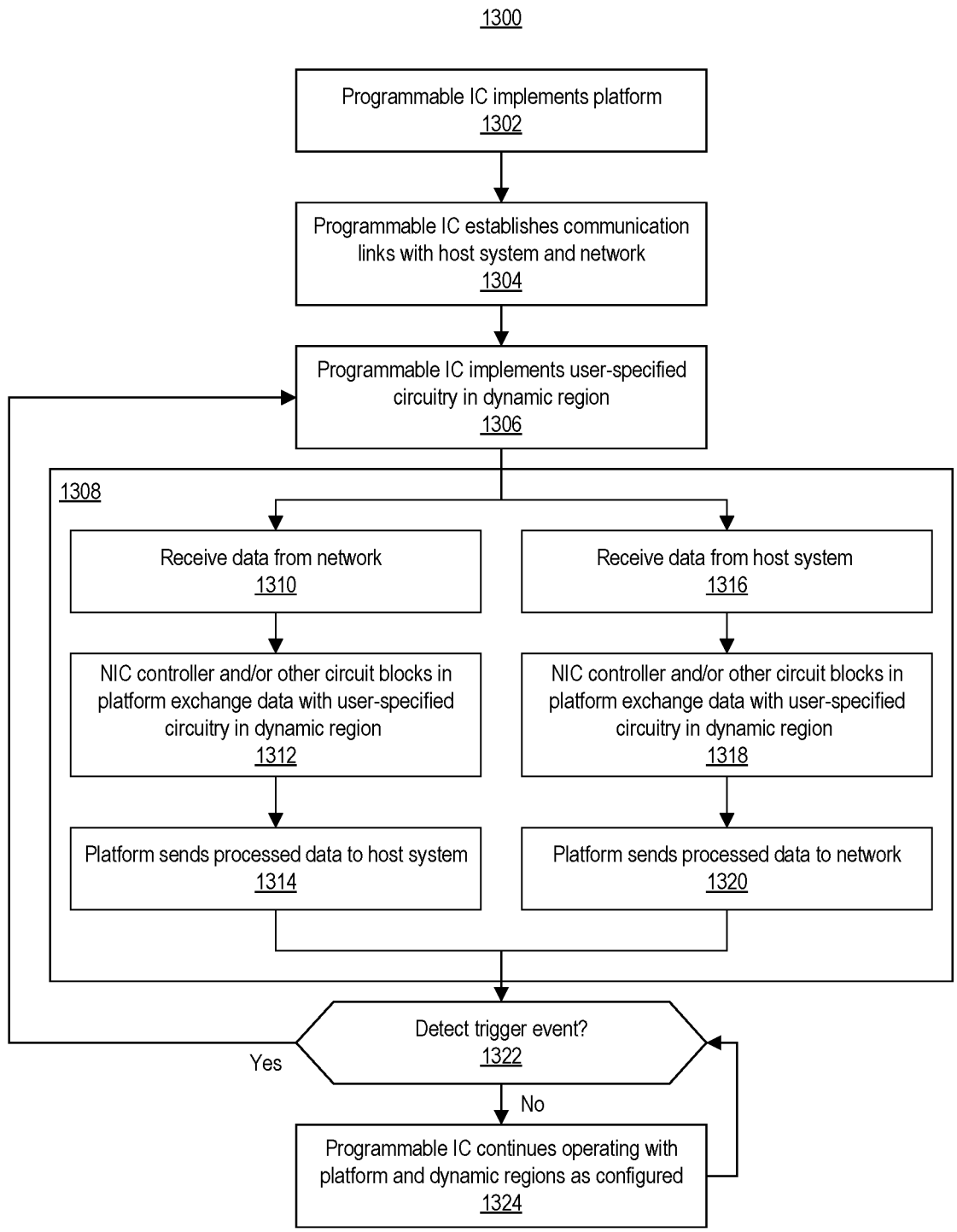
FIG. 13 illustrates an example method of operating a programmable IC implementing smart NIC functionality as described herein.

FIG. 13 illustrates an example method 1300 of operating a programmable IC implementing smart NIC functionality as described herein. In one aspect, the operations described in connection with FIG. 13 relating to configuration of the programmable IC may be performed or initiated by the host system.

In block 1302, the programmable IC implements a platform in the device. The platform is at least partially implemented in static circuitry of the programmable IC. For example, the host system is capable of writing a configuration bitstream (e.g., a full or partial configuration bitstream) specifying the platform to non-volatile memory 136. The programmable IC is capable of bootstrapping itself and loading the configuration bitstream for the platform at boot time. The configuration bitstream for the platform may stay resident in the programmable IC for the duration of operation. As discussed, the configuration bitstream defines the static region and physically implements the platform in the static region, at least partially. The loading of a configuration bitstream in block 1302 may also define the dynamic region of the device as the portion of the programmable IC that is not used to implement the platform.

In implementations where the platform is implemented using one or more PR regions, the platform may be specified by loading a plurality of partial configuration bitstreams. For example, one partial configuration bitstream may be loaded that implements the portion of the platform in the static region. For each PR region used to implement the platform, another partial configuration bitstream is loaded for that PR region.

In block 1304, the programmable IC establishes communication links with the host system and the network. For example, the PCIe controller of the platform establishes a communication link with the host system. The Ethernet interface of the platform establishes a communication link with the network, e.g., a node or switch in the network. It should be appreciated, that once the platform is implemented in the programmable IC, the programmable IC is able to convey data back and forth between the host system and the network.

In block 1306, the programmable IC implements user-specified circuitry in the dynamic region of the device. For example, the host system is capable of initiating partial reconfiguration of the programmable IC by loading a partial configuration bitstream therein. The partial configuration bitstream implements the user-specified circuitry in the dynamic region of the device. In the case where the dynamic region includes a single PR region, a single partial configuration bitstream may be loaded. In the case where the dynamic region includes a plurality of PR regions, the host system is capable of initiating loading of a plurality of partial configuration bitstreams into the programmable IC. For example, one partial configuration bitstream may be loaded for each PR region. In any case, one or more kernels may be implemented in each PR region of the dynamic region to implement the user-specified circuitry.

In one aspect, as part of implementing user-specified circuitry, communication interfaces are selectively enabled and/or disabled based on metadata associated with the partial configuration bitstream(s) that are loaded. In the case where the dynamic region includes a plurality of PR regions, the partial configuration bitstream for a given PR region may include the metadata necessary to program the communication interface of the NIC controller that couples to that particular PR region.

In block 1308, the programmable IC is capable of using the user-specified circuitry to perform one or more operations as described within this disclosure. In block 1308, the user-specified circuitry is operable to process data asymmetrically for both egress and ingress data. That is, while ingress data is processed by one or more kernels in the dynamic region or not processed at all using such kernels, egress data may be processed by one or more different kernels in the dynamic region or not processed at all by such kernels independently of the processing performed on the ingress data.

In block 1308, blocks on the left side illustrate processing of ingress data while blocks on the right side illustrate processing of egress data. In block 1310, the programmable IC receives data from the network. The Ethernet interface receives data and provides the data to the NIC controller. In block 1312, the NIC controller in the platform is capable of exchanging data with the user-specified circuitry in the dynamic region. Data is sent out of one or more of the software-controlled communication interfaces, processed by the user-specified circuitry, and returned to the platform. In block 1314, the platform sends the processed data to the host system. For example, the data is provided to the DMA circuit and to the PCIe controller. The PCIe controller provides the processed data to the host system.

In block 1316, the programmable IC receives data from the host system. The PCIe controller receives data from the host system and provides the data to the DMA circuit. The DMA circuit provides the data to one or more other circuits in the platform. In block 1318, the NIC controller is capable of exchanging data with the user-specified circuitry in the dynamic region. Data is sent out of one or more of the software-controlled communication interfaces, processed by the user-specified circuitry, and returned to the platform. In block 1320, the platform sends the processed data to the network. For example, the data is provided to the Ethernet interface. The Ethernet interface provides the processed data to the network.

In one aspect, as part of block 1308 or at any time under control of a processor as described herein, one or more of the software-controlled communication interfaces of the platform may be turned on or off. For example, each of the software-controlled communication interfaces may be placed in a particular state (on or off) upon implementation of the dynamic region. As the programmable IC continues to operate, the software-controlled communication interfaces may be turned on or off independently of one another and independently of partial reconfiguration of the dynamic region.

For example, a given software-controlled communication interface may be turned on and then, with the dynamic region continuing to operate without interruption, turned off. In some cases, software-controlled communication interfaces may be deactivated when the portion of the dynamic region connected thereto (e.g., the particular PR region) is undergoing partial reconfiguration. Upon successful partial reconfiguration of the PR region, the software-controlled communication interface may be turned back on. In any case, dynamic control over the communication interfaces as described allows the data flows through the dynamic region to be dynamically changed without initiating any partial reconfiguration in the dynamic region.

In block 1322, a determination is made as to whether a trigger event is detected. In one aspect, the host system is capable of receiving requests for different types of user-specified circuitry to be implemented in the programmable IC, where the request is considered a trigger event for partial reconfiguration. In another example, the trigger event may be a signal or combination of signals detected by the programmable IC itself that causes the programmable IC to notify the host system that partial reconfiguration is needed. In any case, in response to detecting a trigger event, method 1300 loops back to block 1306. In response to not detecting a trigger event, method 1300 continues to block 1324 where the programmable IC continues to operate with the current configuration for both the platform and the dynamic region. Method 1300 may iterate between blocks 1322 and 1324 until such time that a trigger event is detected.

In block 1306, the programmable IC is partially reconfigured. The host system, for example, loads one or more other partial configuration bitstreams into the programmable IC. The programmable IC may implement entirely new user-specified circuitry in the dynamic region (e.g., where the dynamic region includes a single PR region) or only new/different user-specified circuitry in one or more selected or all PR regions of the dynamic region. Further, the number of PR regions implemented in the dynamic region compared to prior configurations of the dynamic region may be changed.

The inventive arrangements described herein illustrate a platform implemented in a programmable IC that supports dynamic, e.g., during runtime, insertion and/or replacement of functions in-line with network traffic. The programmable IC, by way of the platform, is capable of continuing to pass network traffic between the network and a host system without data loss. The inserted functions can be inserted at any of a variety of insertion points within the data flow through the platform.

Figure 14:
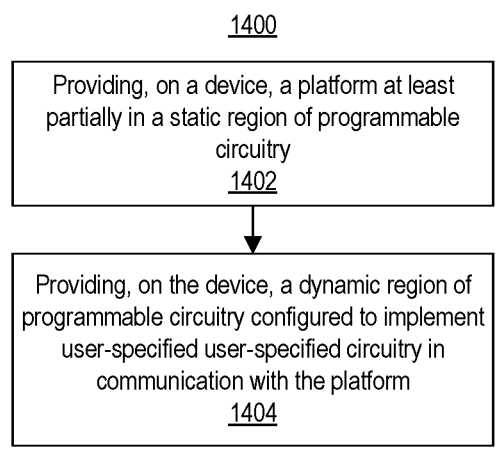
FIG. 14 illustrates an example method of implementing a platform on a programmable IC.

FIG. 14 illustrates an example method 1400 of implementing a platform on a programmable IC. In block 1402, a platform at least partially implemented in a static region of programmable circuitry is provided on a device. In block 1404, a dynamic region of programmable circuitry configured to implement user-specified circuitry in communication with the platform is provided on the device. The platform is configured to establish and maintain a first communication link with a host data processing system and a second communication link with a network while at least a portion of the dynamic region of programmable circuitry is dynamically reconfigured.

Figure 15:
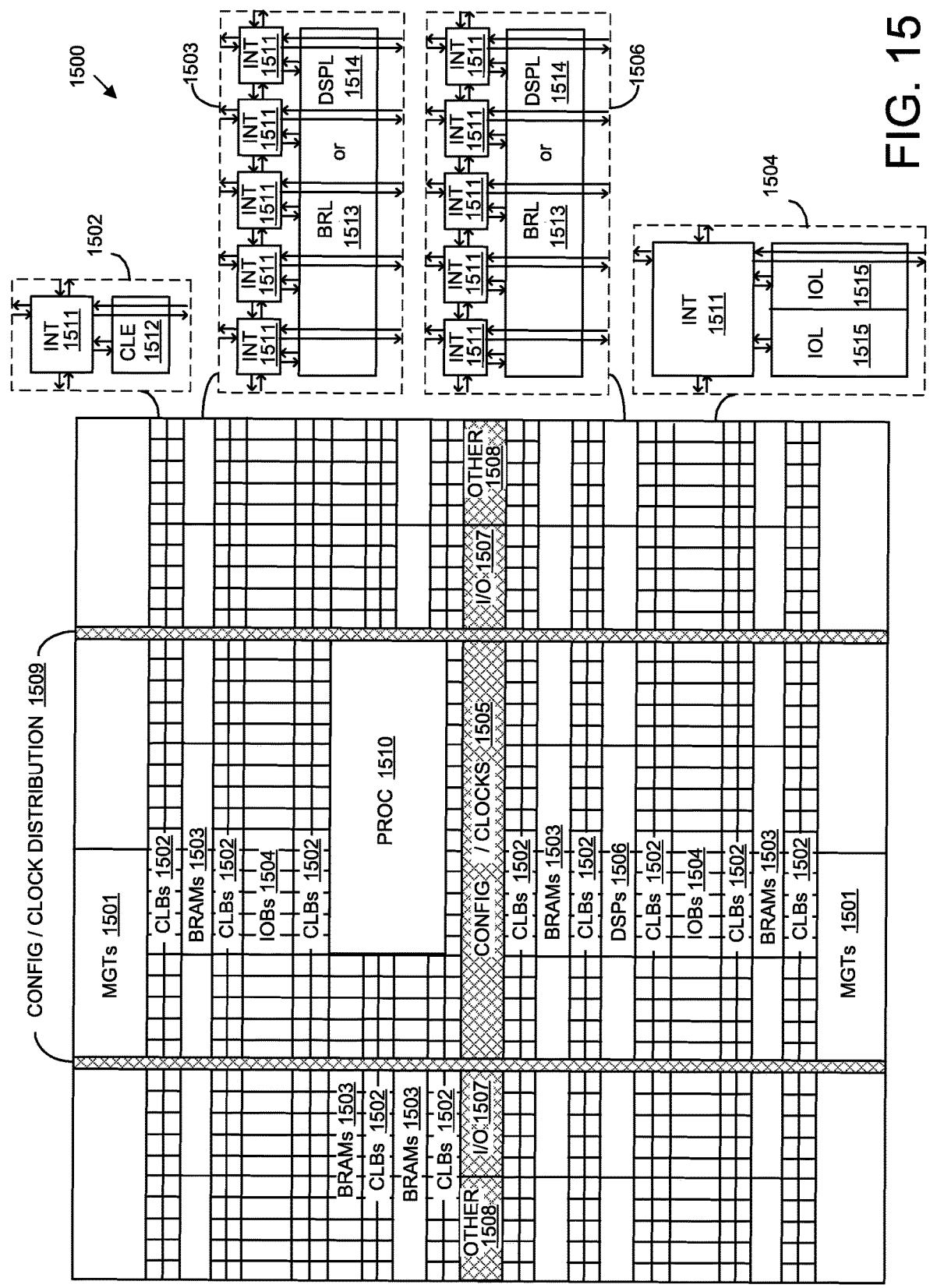
FIG. 15 illustrates an example architecture for an IC.

FIG. 15 illustrates an example architecture 1500 for an IC. Architecture 1500 may be used to implement a programmable IC as described herein such as programmable IC 132. As an example, architecture 1500 may be used to implement a field programmable gate array (FPGA). Architecture 1500 may also be representative of a system-on-chip (SoC) type of IC. An SoC is an IC that includes a processor that executes program code and one or more other circuits. The other circuits may be implemented as hardwired circuitry, programmable circuitry, and/or a combination thereof. The circuits may operate cooperatively with one another and/or with the processor.

As shown, architecture 1500 includes several different types of programmable circuit, e.g., logic, blocks. For example, architecture 1500 may include a large number of different programmable tiles including multi-gigabit transceivers (MGTs) 1501, configurable logic blocks (CLBs) 1502, random access memory blocks (BRAMs) 1503, input/output blocks (IOBs) 1504, configuration and clocking logic (CONFIG/CLOCKS) 1505, digital signal processing blocks (DSPs) 1506, specialized I/O blocks 1507 (e.g., configuration ports and clock ports), and other programmable logic 1508 such as digital clock managers, analog-to-digital converters, system monitoring logic, and so forth.

In some ICs, each programmable tile includes a programmable interconnect element (INT) 1511 having standardized connections to and from a corresponding INT 1511 in each adjacent tile. Therefore, INTs 1511, taken together, implement the programmable interconnect structure for the illustrated IC. Each INT 1511 also includes the connections to and from the programmable logic element within the same tile, as shown by the examples included at the top of FIG. 15.

For example, a CLB 1502 may include a configurable logic element (CLE) 1512 that may be programmed to implement user logic plus a single INT 1511. A BRAM 1503 may include a BRAM logic element (BRL) 1513 in addition to one or more INTs 1511. Typically, the number of INTs 1511 included in a tile depends on the height of the tile. As pictured, a BRAM tile has the same height as five CLBs, but other numbers (e.g., four) also may be used. A DSP tile 1506 may include a DSP logic element (DSPL) 1514 in addition to an appropriate number of INTs 1511. An IOB 1504 may include, for example, two instances of an I/O logic element (IOL) 1515 in addition to one instance of an INT 1511. The actual I/O pads connected to IOL 1515 may not be confined to the area of IOL 1515.

In the example pictured in FIG. 15, a horizontal area near the center of the die, e.g., formed of regions 1505, 1507, and 1508, may be used for configuration, clock, and other control logic. Vertical areas 1509 extending from this horizontal area may be used to distribute the clocks and configuration signals across the breadth of the programmable IC.

Some ICs utilizing the architecture illustrated in FIG. 15 include additional logic blocks that disrupt the regular columnar structure making up a large part of the IC. The additional logic blocks may be programmable blocks and/or dedicated circuitry. For example, a processor block depicted as PROC 1510 spans several columns of CLBs and BRAMs.

In one aspect, PROC 1510 may be implemented as dedicated circuitry, e.g., as a hardwired processor, that is fabricated as part of the die that implements the programmable circuitry of the IC. PROC 1510 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 1510 may be omitted from architecture 1500 and replaced with one or more of the other varieties of the programmable blocks described. Further, such blocks may be utilized to form a "soft processor" in that the various blocks of programmable circuitry may be used to form a processor that can execute program code as is the case with PROC 1510.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 15 that are external to PROC 1510 such as CLBs 1502 and BRAMs 1503 are considered programmable circuitry of the IC.

In general, the functionality of programmable circuitry is not established until configuration data is loaded into the IC. A set of configuration bits may be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 1510.

In some instances, hardwired circuitry may have one or more operational modes that can be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

In the case of an SoC, the configuration bitstream may specify the circuitry that is to be implemented within the programmable circuitry and the program code that is to be executed by PROC 1510 or a soft processor. In some cases, architecture 1500 includes a dedicated configuration processor that loads the configuration bitstream to the appropriate configuration memory and/or processor memory. The dedicated configuration processor does not execute user-specified program code. In other cases, architecture 1500 may utilize PROC 1510 to receive the configuration bitstream, load the configuration bitstream into appropriate configuration memory, and/or extract program code for execution.

FIG. 15 is intended to illustrate an example architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 15 are purely illustrative. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 1510 within the IC are for purposes of illustration only and are not intended as limitations.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the term "processor" means at least one hardware circuit. The hardware circuit may be configured to carry out instructions contained in program code. The hardware circuit may be an integrated circuit. Examples of a processor include, but are not limited to, a central processing unit (CPU), an array processor, a vector processor, a digital signal processor (DSP), an FPGA, a programmable logic array (PLA), an ASIC, programmable logic circuitry, and a controller.

As defined herein, the term "real-time" means a level of processing responsiveness that a user or system senses as sufficiently immediate for a particular process or determination to be made, or that enables the processor to keep up with some external process.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object-oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

A device includes a platform implemented, at least in part, in a static region of programmable circuitry and a dynamic region of programmable circuitry configured to implement user-specified circuitry in communication with the platform. The platform is configured to establish and maintain a first communication link with a host data processing system and a second communication link with a network while at least a portion of the dynamic region of programmable circuitry is dynamically reconfigured.

In another aspect, the platform includes an Ethernet interface coupled to a NIC controller, a DMA circuit coupled to the network interface card controller, and a PCIe interface coupled to the DMA circuit.

In another aspect, at least one of the Ethernet interface, the DMA circuit, or the network interface card controller is implemented in a partially reconfigurable region.

In another aspect, the user-specified circuitry is configured to perform packet processing.

In another aspect, the platform includes a NIC controller having a communication interface connected to the dynamic region.

In another aspect, the communication interface is located between a MAC and a first stage of the NIC controller.

In another aspect, the communication interface is software activatable.

In another aspect, the NIC controller includes a plurality of interconnected stages and at least one of the plurality of interconnected stages has the communication interface.

In another aspect, a first stage and a second stage of the plurality of interconnected stages each has an independent communication interface configured to connect to the dynamic region.

In another aspect, each communication interface connects to a different partial reconfiguration region in the dynamic region and each partial reconfiguration region is independently reconfigurable to implement different user-specified circuits.

In another aspect, the platform continues to operate uninterrupted while the dynamic region is reconfigured to implement different user-specified circuitry in communication with the platform.

A method includes providing, on a device, a platform at least partially implemented in a static region of programmable circuitry and providing, on the device, a dynamic region of programmable circuitry configured to implement user-specified circuitry in communication with the platform. The platform is configured to establish and maintain a first communication link with a host data processing system and a second communication link with a network while at least a portion of the dynamic region of programmable circuitry is dynamically reconfigured.

In another aspect, the platform includes an Ethernet interface coupled to a NIC controller, a DMA circuit coupled to the NIC controller, and a PCIe interface coupled to the DMA circuit.

In another aspect, at least one of the Ethernet interface, the DMA circuit, or the network interface card controller is implemented in a partially reconfigurable region.

In another aspect, the user-specified circuitry is configured to perform packet processing.

In another aspect, the method includes providing, within the platform, a NIC controller having a communication interface connected to the dynamic region.

In another aspect, the communication interface is located between a MAC and a first stage of the NIC controller.

In another aspect, the method includes selectively activating the communication interface under software control.

In another aspect, the method includes providing a plurality of interconnected stages in the network interface card controller and providing the communication interface for at least one of the plurality of interconnected stages.

In another aspect, the method includes providing a first stage and a second stage of the plurality of interconnected stages, wherein each of the first stage and the second stage has an independent communication interface configured to connect to the dynamic region.

In another aspect, each communication interface connects to a different partial reconfiguration region in the dynamic region and each partial reconfiguration region is independently reconfigurable to implement different user-specified circuits.

In another aspect, the method includes reconfiguring the dynamic region to implement different user-specified circuitry in communication with the platform while the platform continues to operate uninterrupted.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A device, comprising:
a platform implemented, at least in part, in a static region of programmable circuitry;
a dynamic region of programmable circuitry configured to implement user-specified circuitry in communication with the platform, wherein the user-specified circuitry implements a network-attached acceleration function;
wherein the platform is configured to establish and maintain a first communication link with a host data processing system external to the device and a second communication link with a network external to the device while at least a portion of the dynamic region of programmable circuitry is dynamically reconfigured to change the network-attached acceleration function implemented therein;
wherein the platform includes a network interface card controller having a communication interface connected to the user-specified circuitry implemented in the dynamic region;
wherein the communication interface is configured to send data to and receive data from the user-specified circuitry; and
wherein the platform is configured to pass data between the host data processing system and the network while the dynamic region of programmable circuitry is dynamically reconfigured.

2. The device of claim 1, wherein the platform comprises:
an Ethernet interface connected to the network interface card controller and configured to establish the second communication link, a direct memory access (DMA) circuit connected to the network interface card controller, and a Peripheral Component Interconnect Express (PCIe) interface connected to the DMA circuit and configured to establish the first communication link.

3. The device of claim 2, wherein at least one of the Ethernet interface, the DMA circuit, or the network interface card controller is implemented in a partially reconfigurable region.

4. The device of claim 1, wherein the user-specified circuitry is configured to operate on data received from the network interface card controller and provide processed data back to the network interface card controller.

5. The device of claim 1, wherein the communication interface is located between a Medium Access Controller and a first stage of the network interface card controller.

6. The device of claim 1, wherein the communication interface is selectively enabled by the host data processing system.

7. The device of claim 1, wherein the network interface card controller includes a plurality of interconnected stages and the communication interface connects at least one of the plurality of interconnected stages to the user-specified circuitry.

8. The device of claim 7, wherein the communication interface connects a first stage of the plurality of interconnected stages to the user-specified circuitry and a further communication interface connects a second stage of the plurality of interconnected stages to the user-specified circuitry; and
wherein the first stage corresponds to a network interface card core and the second stage corresponds to an accelerator arbitration circuit.

9. The device of claim 8, wherein each communication interface connects to a different partial reconfiguration region in the dynamic region and each partial reconfiguration region is independently reconfigurable to implement different user-specified circuits.

10. The device of claim 1, wherein the device is an integrated circuit.

11. A method, comprising:
providing, on a device, a platform at least partially implemented in a static region of programmable circuitry;
providing, on the device, a dynamic region of programmable circuitry configured to implement user-specified circuitry in communication with the platform, wherein the user-specified circuitry implements a network-attached acceleration function;
wherein the platform is configured to establish and maintain a first communication link with a host data processing system external to the device and a second communication link with a network external to the device while at least a portion of the dynamic region of programmable circuitry is dynamically reconfigured to change the network-attached acceleration function implemented therein; and
providing, within the platform, a network interface card controller having a communication interface connected to the user-specified circuitry implemented in the dynamic region;
wherein the communication interface is configured to send data to and receive data from the user-specified circuitry; and
wherein the platform is configured to pass data between the host data processing system and the network while the dynamic region of programmable circuitry is dynamically reconfigured.

12. The method of claim 11, wherein the platform comprises:
an Ethernet interface connected to the network interface card controller and configured to establish the second communication link, a direct memory access (DMA) circuit connected to the network interface card controller, and a Peripheral Component Interconnect Express (PCIe) interface connected to the DMA circuit and configured to establish the first communication link.

13. The method of claim 12, wherein at least one of the Ethernet interface, the DMA circuit, or the network interface card controller is implemented in a partially reconfigurable region.

14. The method of claim 11, wherein the user-specified circuitry is configured to operate on data received from the network interface card controller and provide processed data back to the network interface card controller.

15. The method of claim 11, wherein the communication interface is located between a Medium Access Controller and a first stage of the network interface card controller.

16. The method of claim 11, further comprising:
selectively enabling the communication interface under control of the host data processing system.

17. The method of claim 11, further comprising:
providing a plurality of interconnected stages in the network interface card controller; and
wherein the communication interface connects at least one of the plurality of interconnected stages to the user-specified circuitry.

18. The method of claim 17, further comprising:
providing a first stage and a second stage of the plurality of interconnected stages;
wherein the first stage corresponds to a network interface card core and the second stage corresponds to an accelerator arbitration circuit; and
wherein the first stage is connected to the user-specified circuitry by the communication interface and the second stage is connected to the user-specified circuitry by a further communication interface.

19. The method of claim 17, wherein each communication interface connects to a different partial reconfiguration region in the dynamic region and each partial reconfiguration region is independently reconfigurable to implement different user-specified circuits.

20. The method of claim 11, wherein device is an integrated circuit.

* * * * *

UNITED STATES PATENT AND TRADEMARK OFFICE
CERTIFICATE OF CORRECTION

PATENT NO. : 10,990,547 B2
APPLICATION NO. : 16/537605
DATED : April 27, 2021
INVENTOR(S) : Thyamagondlu et al.

It is certified that error appears in the above-identified patent and that said Letters Patent is hereby corrected as shown below:

In the Specification

In Column eight, Line 29, "dynamic region 202" should read --dynamic region 204--.
In Column eight, Line 30 and 31, "dynamic region 202" should read --dynamic region 204--.
In Column eighteen, Line 14, "dynamic region 202" should read --dynamic region 204--.
In Column eighteen, Line 38, "dynamic region 202" should read --dynamic region 204--.
In Column twenty, Line 13, "arbitration 908" should read --arbitration circuit 908--.
In Column twenty, Line 24, "network kernels 1104, 1108" should read --network kernels 1104 and compute kernels 1108--.
In Column twenty, Line 28, "network kernel(s) 1108" should read --compute kernels 1108--.
In Column twenty-one, Line 14, "dynamic region 202" should read --dynamic region 204--.
In Column twenty-one, Line 60, "dynamic region 202" should read --dynamic region 204--.
In Column twenty-one, Line 66, "dynamic region 202" should read --dynamic region 204--.
In Column twenty-two, Line 2, "dynamic region 202" should read --dynamic region 204--.
In Column twenty-two, Line 6, "dynamic region 202" should read --dynamic region 204--.

Signed and Sealed this
Third Day of May, 2022

Katherine Kelly Vidal
*Director of the United States Patent and Trademark Office*